United States Patent
Hamaguchi et al.

[19]

[11] Patent Number: 5,821,762
[45] Date of Patent: Oct. 13, 1998

[54] SEMICONDUCTOR DEVICE, PRODUCTION METHOD THEREFOR, METHOD FOR TESTING SEMICONDUCTOR ELEMENTS, TEST SUBSTRATE FOR THE METHOD AND METHOD FOR PRODUCING THE TEST SUBSTRATE

[75] Inventors: Tsuneo Hamaguchi; Kenji Kagata; Goro Izuta; Mitsunori Ishizaki; Osamu Hayashi; Susumu Hoshinouchi, all of Hyogo-ken, Japan

[73] Assignee: Mitsubishi Denki Kabushiki Kaisha, Tokyo, Japan

[21] Appl. No.: 753,882

[22] Filed: Dec. 2, 1996

Related U.S. Application Data

[62] Division of Ser. No. 393,891, Feb. 24, 1995, abandoned.

[30]    Foreign Application Priority Data

Feb. 28, 1994  [JP]  Japan .................................. 6-030341

[51] Int. Cl.[6] ...................................................... G01R 31/02
[52] U.S. Cl. ............................................ 324/754; 324/765
[58] Field of Search ................................... 324/754, 765; 437/8; 438/14–18

[56]                References Cited

U.S. PATENT DOCUMENTS

| | | | |
|---|---|---|---|
| 5,138,436 | 8/1992 | Koepf ..................................... | 257/723 |
| 5,198,963 | 3/1993 | Gupta et al. ............................ | 257/777 |
| 5,262,351 | 11/1993 | Bureau et al. .......................... | 437/208 |
| 5,440,239 | 8/1995 | Zappella et al. ........................ | 324/757 |
| 5,494,856 | 2/1996 | Beaumont et al. ........................ | 437/8 |

FOREIGN PATENT DOCUMENTS

| | | | |
|---|---|---|---|
| 58143556 | 8/1983 | Japan ..................................... | 257/724 |
| 03093259 | 4/1991 | Japan ..................................... | 257/777 |
| 03152967 | 6/1991 | Japan ..................................... | 257/724 |
| 04290258 | 10/1992 | Japan . | |
| 05074989 | 3/1993 | Japan ..................................... | 257/723 |
| 05129516 | 5/1993 | Japan ..................................... | 257/723 |

OTHER PUBLICATIONS

"Various Problems of Multi–Chip Modules", Electronics Packaging Technology, May 1993, pp. 47–51.

"Development Trends, Purposes and Problems of Surface Laminar Circuits", Society for Hybrid Microelectronics, Nov. 5, 1993, pp. 19–23.

"Bare Chip Test Techniques for Multichip Modules", Proceedings of 40th Electronic Components & Technology Conference, 1990, pp. 554–558 (Month Unavailable).

"Very High Speed Multilayer Interconnect Using Photosensitive Polymides", Microelectronics, 1988, pp. 363–365 (Month Unavailable).

*Primary Examiner*—Josie Ballato
*Assistant Examiner*—Russell M. Kobert
*Attorney, Agent, or Firm*—Sughrue, Mion, Zinn, Macpeak & Seas, PLLC

[57]                    ABSTRACT

A high-speed, high-density, small-sized, low-cost semiconductor device wherein the feeder substrate 2 for supplying power to the semiconductor elements 3 as a bare chip has the containers 2a for containing the semiconductor elements 3, the semiconductor elements 3 are bonded to the wiring layer 1b of the signal transmission substrate 1 for transmitting signals to the semiconductor elements 3 and contained in the containers 2a, the containers 2a are covered with the signal transmission substrate 1, and the signal transmission substrate 1 is superposed upon and bonded to the feeder substrate 2.

18 Claims, 21 Drawing Sheets

SEMICONDUCTOR DEVICE, PRODUCTION METHOD THEREFOR, METHOD FOR TESTING SEMICONDUCTOR ELEMENTS, TEST SUBSTRATE FOR THE METHOD AND METHOD FOR PRODUCING THE TEST SUBSTRATE

This is a divisional of application Ser. No. 08/393,891, filed Feb. 24, 1995, now abandoned.

BACKGROUND OF THE INVENTION

1. [Field of the Invention]

This invention relates to a semiconductor device which mounts semiconductor elements called a "bare chip".

2. [Description of the Prior Art]

To increase the speed and packaging density of a semiconductor device, it is important to reduce the connection distance between semiconductor elements and a wiring board and the wiring distance between semiconductor elements. For this purpose, it is necessary to bond the semiconductor elements directly to the fine wiring layer of the wiring board by solder or other means. Furthermore, since the power consumption of a high-speed semiconductor element is large, it is necessary to reduce resistance by increasing the size of a wire conductor in the feeder layer of the wiring board and to release a large amount of heat generated from the semiconductor elements.

FIG. 30 is a sectional view of a prior art semiconductor device disclosed in "Electronic Material", May 1993, pp 47–51. In FIG. 30, reference numeral 3 represents a semiconductor element, 31 a wiring board, 32 the feeder layer of the wiring board 31, 33 the signal transmission layer of the wiring board 31, 34 a cap, and 1j an input/output terminal. The feeder layer 32 is mainly composed of a ceramic laminate prepared by printing a conductor paste on a green sheet and baking the conductor paste. The signal transmission layer 33 is prepared by forming a copper conductor on a polyimide insulator by means of sputtering and photoengraving technology.

Before mounting semiconductor elements on the semiconductor device, a burn-in test is made on the semiconductor elements in an atmosphere heated to 150° C. to test the function of the semiconductor elements and reproduce their defects or problems. If the semiconductor elements are packaged, the test can be made simply by inserting the leads of the package into a socket, but to test an unpackaged semiconductor element called a "bare chip" has been difficult because of the difficulty of bringing all the electrical connection electrodes of the semiconductor elements into uniform contact with the test pins.

In view of this, the method shown in FIG. 31 has been developed (collection of drafts for the 34th SHM technology lecture meeting, pp.19–23, Tsukada). In the figure, reference numeral 3 represents a semiconductor element, 40 high melting point solder, 41 low melting point solder, 42 a test wire, and 43 a test substrate. In FIG. 31(a), the high melting point solder 40 is formed on the semiconductor element 3 by vapor deposition or other means. In FIG. 31(b), the low melting point solder 41 is formed on the high melting point solder 40. In other words, the low melting point solder 41 is formed on the high melting point solder 40 by forming a hole in the bottom of the container holding molten solder, applying air pressure to the molten solder, and accumulating on top of the high melting point solder 40 the solder pushed from the container hole. In FIG. 31(c), the bottom surface of the low melting point solder 41 is bonded to the top surface of a top end portion of the test wire 42, and an unshown socket is connected to a bottom end portion of the test wire 42 so as to conduct a function test in a heated atmosphere. Furthermore, in FIG. 31(d), the low melting point solder 41 is molten by heat after the test to remove the semiconductor element 3 from the test wire 42 of the test substrate 43. The low melting point solder 41 remains on the test substrate 43. Finally, in FIG. 31(e), the low melting point solder 41 is formed again on the high melting point solder 40 of the semiconductor element 3 which has been verified to be satisfactory by the test, and this non-defective semiconductor element 3 is ready to be packaged.

In the prior art semiconductor device shown in FIG. 30, the cap 34 is provided on the back face of the semiconductor element 3 so as to diffuse heat from the semiconductor element 3. Since this semiconductor device employs the packaging method for mounting these elements on the wiring board 31, it is impossible to reduce the thickness and size of the semiconductor device. Furthermore, the semiconductor device cost is high because it requires the cap 34 to be formed of a metal. Moreover, since the semiconductor element 3 and the wiring board 31 have different thermal expansion coefficients, the semiconductor device has the problem of reliability because thermal stress which may cause cracking is generated in the solder at the connection between the semiconductor element 3 and the wiring board 31.

The prior art method for testing a semiconductor element illustrated in FIG. 31 involves the first problem that the test process is complicated because a protruding electrode has two layers consisting of the high melting point solder 40 and the low melting point solder 41 which have been formed by different methods, and the low melting point solder 41 must be formed again after the test. Furthermore, the test method involves the second problem that a very thin protruding electrode cannot be formed because of the difficulty to align the two solders as the low melting point solder 41 is formed on the high melting point solder 40.

SUMMARY OF THE INVENTION

The present invention is made to solve the above-described problems, and it is therefore an object of the invention to achieve a semiconductor device which permits the high-density packaging of semiconductor elements and achieves high speed signal transmission at a low cost. It is another object of the invention to provide a method for producing the semiconductor device as well as a method for testing semiconductor elements and a test substrate for the method.

According to a first aspect of the invention, there is provided a semiconductor device wherein the feeder substrate for supplying power to unpackaged non-defective semiconductor elements has containers for containing the semiconductor elements, the semiconductor elements are bonded to the wiring layer of the signal transmission substrate for transmitting signals to the semiconductor elements, the semiconductor elements are contained in the containers, the containers are covered with the signal transmission substrate, and the signal transmission substrate is superposed upon and bonded to the feeder substrate.

According to a second aspect of the invention, there is provided a semiconductor device wherein the container of the first aspect of the invention is an opening extending from the front face of the feeder substrate which faces the signal transmission substrate to the opposite back face.

According to a third aspect of the invention, there is provided a semiconductor device wherein a base for supporting the wiring layer of the signal transmission substrate of the first aspect of the invention is made of a material having a thermal expansion coefficient approximate to that of the semiconductor element.

According to a fourth aspect of the invention, there is provided a semiconductor device wherein the wiring layer of the signal transmission substrate of the first aspect of the invention is composed of a polymer material and a conductor, and the base for supporting the wiring layer has the portions connected with the feeder substrate removed.

According to a fifth aspect of the invention, there is provided a semiconductor device wherein the semiconductor elements of the second aspect of the invention are contained in the open containers, the open containers are covered with the signal transmission substrate superposed upon the feeder substrate, and the open containers are filled with a polymer resin which is solidified.

According to a sixth aspect of the invention, there is provided a semiconductor device wherein the container of the first aspect of the invention is a hollow container having a bottom end, and open on the front side of the feeder substrate which faces the signal transmission substrate and closed on the opposite back side of the feeder substrate.

According to a seventh aspect of the invention, there is provided a method for producing a semiconductor device, which comprises the steps of: forming containers for containing semiconductor elements, electrical connection electrodes and sealing pads on the front face of the feeder substrate for supplying power to unpackaged non-defective semiconductor elements, bonding the semiconductor elements to the wiring layer of the signal transmission substrate for transmitting signals to the semiconductor elements, forming electrical connection electrodes and sealing pads on the front face of the signal transmission substrate at positions facing the above-mentioned electrical connection electrodes and sealing pads, superposing the signal transmission substrate upon the feeder substrate while the semiconductor elements bonded to the signal transmission substrate are contained in the containers of the feeder substrate, and bonding the electrical connection electrodes and sealing pads of these substrates to each other at the same time.

According to an eighth aspect of the invention, there is provided a semiconductor device wherein the semiconductor element of the sixth aspect of the invention is bonded to the bottom surface of the hollow container and a heat radiation fin is bonded to the back face of the feeder substrate.

According to a ninth aspect of the invention, there is provided a semiconductor device wherein the feeder substrate having the open containers for containing the semiconductor elements of the second aspect of the invention has the same thickness as or a larger thickness than the total thickness of two semiconductor elements contained back to back in the open container, the semiconductor elements bonded to the signal transmission substrates are contained back to back in the open containers of the feeder substrate from both sides of the feeder substrate, and the signal transmission substrates having the semiconductor elements bonded thereto are bonded to both sides of the feeder substrate.

According to a tenth aspect of the invention, there is provided a semiconductor device wherein the signal transmission substrate of the first aspect of the invention has flexibility because it is composed of a polymer insulator and a metal conductor.

According to an eleventh aspect of the invention, there is provided a semiconductor device wherein the signal transmission substrate of the tenth aspect of the invention has a conductor on the back face thereof opposite to the front face facing the feeder substrate.

According to a twelfth aspect of the invention, there is provided a semiconductor device wherein the signal transmission substrate of the tenth aspect of the invention has input/output terminals on the back face thereof opposite to the front face facing the feeder substrate.

According to a thirteenth aspect of the invention, there is provided a semiconductor device wherein the feeder substrate of the first or tenth aspect of the invention has input/output terminals on the front face thereof facing the signal transmission substrate, and the signal transmission substrate has input/output terminals on the back face thereof opposite to the front face facing the feeder substrate.

According to a fourteenth aspect of the invention, there is provided a semiconductor device wherein pores are formed in the bottom of the hollow container of the sixth or tenth aspect of the invention.

According to a fifteenth aspect of the invention, there is provided a semiconductor device wherein the semiconductor elements of the second or tenth aspect of the invention are bonded to both sides of the signal transmission substrate, the feeder substrates having the open containers are superposed upon and bonded to both sides of the signal transmission substrate, and the semiconductor elements are contained in the open containers of the feeder substrates.

According to a sixteenth aspect of the invention, there is provided a semiconductor device wherein the semiconductor elements of the sixth or tenth aspect of the invention are bonded to both sides of the signal transmission substrate, the feeder substrates having the hollow containers are superposed upon and bonded to both sides of the signal transmission substrate so that the hollow containers face each other, and the semiconductor elements are contained in the hollow containers of the feeder substrates.

According to a seventeenth aspect of the invention, there is provided a method for testing a semiconductor element which comprises the steps of: forming protruding electrodes on the test substrate having test wires to electrically connect the protruding electrodes to the test wires, bonding the electrical connection electrodes of an unpackaged semiconductor element to the protruding electrodes formed on the test substrate, testing the semiconductor element in a heated atmosphere, and removing the semiconductor element from the test substrate after the test to remove the protruding electrodes from the test substrate together with the electrical connection electrodes of the semiconductor element.

According to an eighteenth aspect of the invention, there is provided a test substrate for testing a semiconductor element wherein protruding electrodes and test wires are formed on the front face of the test substrate, and the protruding electrode is connected to the end of the test wire.

According to a nineteenth aspect of the invention, there is provided a test substrate for testing a semiconductor element wherein all the test wires disposed on the front face of the test substrate excluding the protruding electrodes are covered with a polymer resin and the polymer resin outside the test wires is bonded to the front face of the test substrate.

According to a twentieth aspect of the invention, there is provided a test substrate for testing a semiconductor element wherein the protruding electrodes are formed by plating.

According to a twenty-first aspect of the invention, there is provided a test substrate for testing a semiconductor element wherein the protruding electrode is formed of a plurality of metal layers which are placed one upon another.

According to a twenty-second aspect of the invention, there is provided a test substrate for testing a semiconductor element wherein the protruding electrodes and test wires are formed on the front face of the test substrate and the protruding electrode is connected to the test wire by the film thinner than the test wire.

According to a twenty-third aspect of the invention, there is provided a test substrate for testing a semiconductor element, which is composed of a flexible polymer resin and a metal conductor.

According to a twenty-fourth aspect of the invention, there is provided a test substrate for testing a semiconductor element wherein a thin metal film is provided between the protruding electrode and the test substrate of the twenty-third aspect of the invention.

According to a twenty-fifth aspect of the invention, there is provided a method for producing a test substrate, which comprises the steps of: forming protruding electrodes on the test substrate and polishing the top portion of the protruding electrode.

According to a twenty-sixth aspect of the invention, there is provided a method for testing a semiconductor element, which comprises the step of etching a portion of the protruding electrode which is removed from the test substrate together with the electrical connection electrodes in addition to the steps of the seventeenth aspect of the invention.

According to a twenty-seventh aspect of the invention, there is provided a method for testing a semiconductor element which comprises the step of polishing a portion of the protruding electrode which is removed from the test substrate together with the electrical connection electrodes in addition to the steps of the seventeenth aspect of the invention.

According to the semiconductor device of the first aspect of the invention, since the signal transmission substrate and the feeder substrate are superposed upon and bonded to each other and the semiconductor elements bonded to the signal transmission substrate are contained in the containers of the feeder substrate, the semiconductor device is made thin and small in size. Furthermore, since the semiconductor elements are bonded to the wiring layer of the signal transmission substrate, the length of the signal passage between adjacent semiconductor elements becomes short and signal processing is speeded up.

According to the semiconductor device of the second aspect of the invention, since the open container is open on the back face of the feeder substrate which does not face the signal transmission substrate when the signal transmission substrate and the feeder substrate are superposed upon and bonded to each other, heat generated from the semiconductor element is radiated quickly from the open container to the outside of the back face of the feeder substrate.

According to the semiconductor device of the third aspect of the invention, since the base of the signal transmission substrate is made of a material having a thermal expansion coefficient approximate to that of the semiconductor element, the base supports the wiring layer and the amount of thermal stress generated at the connection between the semiconductor element and the signal transmission substrate is reduced, thereby securing the electrical connection between the semiconductor element and the signal transmission substrate.

According to the semiconductor device of the fourth aspect of the invention, since the base of the signal transmission substrate has portions removed, when the signal transmission substrate is bonded to the feeder substrate, portions of the wiring layer corresponding to the removed portions are displaced along the uneven surface of the feeder substrate and adhered to the surface, thereby improving electrical connection.

According to the semiconductor device of the fifth aspect of the invention, since the open containers containing the semiconductor elements are filled with a polymer resin, the areas around the connection between the semiconductor element and the signal transmission substrate and around the connection between the signal transmission substrate and the feeder substrate can be made water-tight. Furthermore, the polymer resin charged into the areas around the connection between the semiconductor element and the signal transmission substrate and around the connection between the signal transmission substrate and the feeder substrate alleviates thermal stress at the these connections, thereby improving the electrical connection between the semiconductor element and the signal transmission substrate and the electrical connection between the signal transmission substrate and the feeder substrate.

According to the semiconductor device of the sixth aspect of the invention, since the semiconductor element in the hollow container is bonded to the signal transmission substrate, the semiconductor element is sealed with the hollow container and the signal transmission substrate, thereby eliminating the need for a specific sealing cap. Furthermore, heat generated from the semiconductor element is radiated from the bottom of the hollow container to the outside of the back face of the feeder substrate, thereby securing heat radiation without the need for a heat radiation fin.

According to the semiconductor device of the seventh aspect of the invention, since the signal transmission substrate and the feeder substrate are superposed upon each other and the electrical connection electrodes and sealing pads of these substrates are bonded to each other at the same time, it is possible to reduce the number of production processes.

According to the semiconductor device of the eighth aspect of the invention, since the semiconductor element is bonded to the bottom of the hollow container and the heat radiation fin is provided on the back face of the feeder substrate which constitutes the bottom of the hollow container, heat generated from the semiconductor element is quickly conveyed to the heat radiation fin and radiated to the outside of the semiconductor device.

According to the semiconductor device of the ninth aspect of the invention, since the feeder substrate is sandwiched between two signal transmission substrates and the semiconductor elements bonded to the two signal transmission substrates are contained back to back within the feeder substrate, the thickness of the semiconductor device is not so large and yet the packaging density of the semiconductor elements is doubled.

According to the semiconductor device of the tenth aspect of the invention, since the signal transmission substrate has flexibility and is displaced along the uneven surface of the feeder substrate and the signal transmission substrate absorbs thermal stress at its connection with the semiconductor element, the electrical connection between the signal transmission substrate and the semiconductor element is secured.

According to the semiconductor device of the eleventh aspect of the invention, since the signal transmission substrate has flexibility without a support base and the metal film provided on the back face of the signal transmission substrate provides an electromagnetic shield to the wiring of the semiconductor device, high noise resistance can be obtained.

According to the semiconductor device of the twelfth aspect of the invention, since the input/output terminals are provided on the back face of the signal transmission substrate, when the semiconductor device is mounted on a mother board, the input/output terminals are displaced along the uneven surface of the mother board, thereby improving the reliability of electrical connection between the semiconductor device and the mother board.

According to the semiconductor device of the thirteenth aspect of the invention, since the signal transmission substrate has input/output terminals and the feeder substrate has input/output terminals, these input and output electrodes can be divided for signal transmission and power supply applications and various-sized electrodes can be formed for each application purpose, thereby improving the performance of the semiconductor device.

According to the semiconductor device of the fourteenth aspect of the invention, since the bottom of the hollow container has pores, heat generated from the semiconductor element can be radiated to the outside of the back face of the feeder substrate efficiently. Furthermore, when the semiconductor element is bonded to the bottom of the hollow container with an adhesive, the adhesive enters the pores and the adhesive present between the semiconductor element and the bottom of the hollow container becomes thin, and heat generated from the semiconductor element is radiated efficiently to the outside of the back face of the feeder substrate. Moreover, when a heat radiation fin is provided on the back face of the feeder substrate, the adhesive entering the pores flows out to the back face of the feeder substrate and serves efficiently as an adhesive for bonding the heat radiation fin, thereby making it easy to install the heat radiation fin on the feeder substrate.

According to the semiconductor device of the fifteenth aspect of the invention, since the signal transmission substrate is made thin, the semiconductor elements are bonded to both surfaces of the thin signal transmission substrate which is sandwiched between two feeder substrates, and the semiconductor elements are contained within the feeder substrates, the thickness of the semiconductor device is increased only by the thickness of a single feeder substrate and yet the packaging density is doubled.

According to the semiconductor device of the sixteenth aspect of the invention, since the signal transmission substrate is made thin and the semiconductor elements are bonded to both surfaces of the thin signal transmission substrate which is sandwiched between two feeder substrates, the semiconductor element is sealed, resulting in high-density packaging and high reliability.

According to the semiconductor testing method of the seventeenth aspect of the invention, since the protruding electrodes are removed from the test substrate together with the semiconductor element when the semiconductor element is taken away from the test substrate after completion of the test, the protruding electrodes remain on the semiconductor element. In other words, as the semiconductor element test and the formation of the protruding electrodes on the semiconductor element are performed at the same time, the test process is simplified and test costs are reduced.

According to the test substrate of the eighteenth aspect of the invention, since the protruding electrodes are formed on the insulator of the test substrate and connected to the end surfaces of the test wires, the bonding strength between the protruding electrode and the test substrate is smaller than the bonding strength between the protruding electrode and the semiconductor element, thereby making it easy to take away the semiconductor element from the test substrate after the test and securing the formation of the protruding electrodes on the semiconductor element.

According to the test substrate of the nineteenth aspect of the invention, since the polymer resin covers all the test wires excluding the protruding electrodes and supports the test wires, the test wires can be prevented from separating from the test substrate when the protruding electrodes are removed from the test substrate together with the semiconductor element.

According to the test substrate of the twentieth aspect of the invention, since the protruding electrode is formed by plating, a protruding electrode formed of many kinds of metals can be easily obtained.

According to the test substrate production method of the twenty-first aspect of the invention, since the protruding electrode is made of a plurality of metals, gold-to-gold thermal diffusion bonding is made possible in addition to solder bonding, thereby expanding the conditions for connecting the semiconductor element to the wiring board.

According to the test substrate of the twenty-second aspect of the invention, since the protruding electrode and the test wire are interconnected by a thin film conductor thinner than the test wire, the protruding electrodes can be easily removed, leaving the test wires on the test substrate.

According to the test substrate of the twenty-third aspect of the invention, since the test substrate is composed of a polymer resin and a metal, the test substrate has flexibility, thereby making it easy to remove the protruding electrodes together with the semiconductor element when the semiconductor element is removed from the test substrate.

According to the test substrate of the twenty-fourth aspect of the invention, since gold is provided between the test substrate made of a polymer resin and the protruding electrode, the bonding strength between the protruding electrode and the test substrate becomes small, thereby making it easy to remove the semiconductor element from the test substrate.

According to the test substrate production method of the twenty-fifth aspect of the invention, since top end portions of the protruding electrode are polished after the protruding electrodes are formed on the test substrate, the protruding electrodes are all made of uniform height, thereby making possible uniform connection between the semiconductor element and the protruding electrodes.

According to the semiconductor element testing method of th e twenty-sixth aspect of the invention, since top end portions of the protruding electrodes are etched after the protruding electrodes are removed from the test substrate together with the semiconductor element, the surface of the protruding electrode is cleaned, thereby improving the connection between the semiconductor element and the wiring board.

According to the semiconductor element testing method of the twenty-seventh aspect of the invention, since top end portions of the protruding electrodes are polished after the protruding electrodes are removed from the test substrate together with the semiconductor element, the protruding electrodes are all made of uniform height, thereby improving the connection between the semiconductor element and the wiring board.

The above and other objects, features and advantages of the invention will become more apparent from the following description when taken in conjunction with the accompanying drawings.

DESCRIPTION OF THE PREFERRED EMBODIMENT

The preferred embodiments of the invention are described hereinunder with reference to FIGS. 1 to 33 in which the same or corresponding parts as those of the prior art are denoted at the same reference codes.

Embodiment 1

Figure 1:
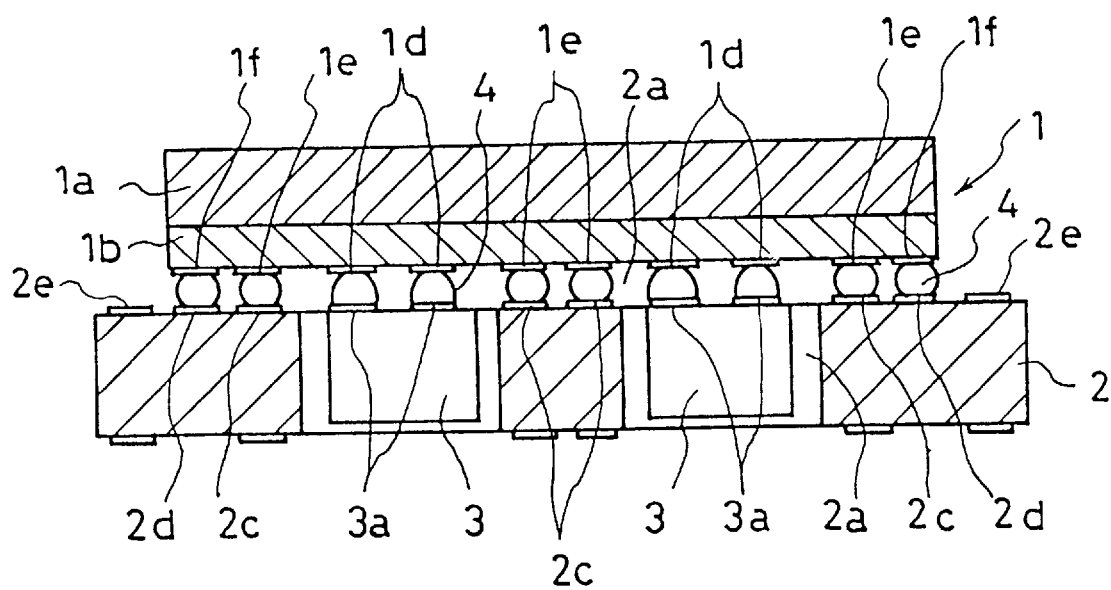
FIG. 1 is a sectional view of a semiconductor device according to Embodiment 1 taken on line A—A of FIG. 2.
Figure 2:
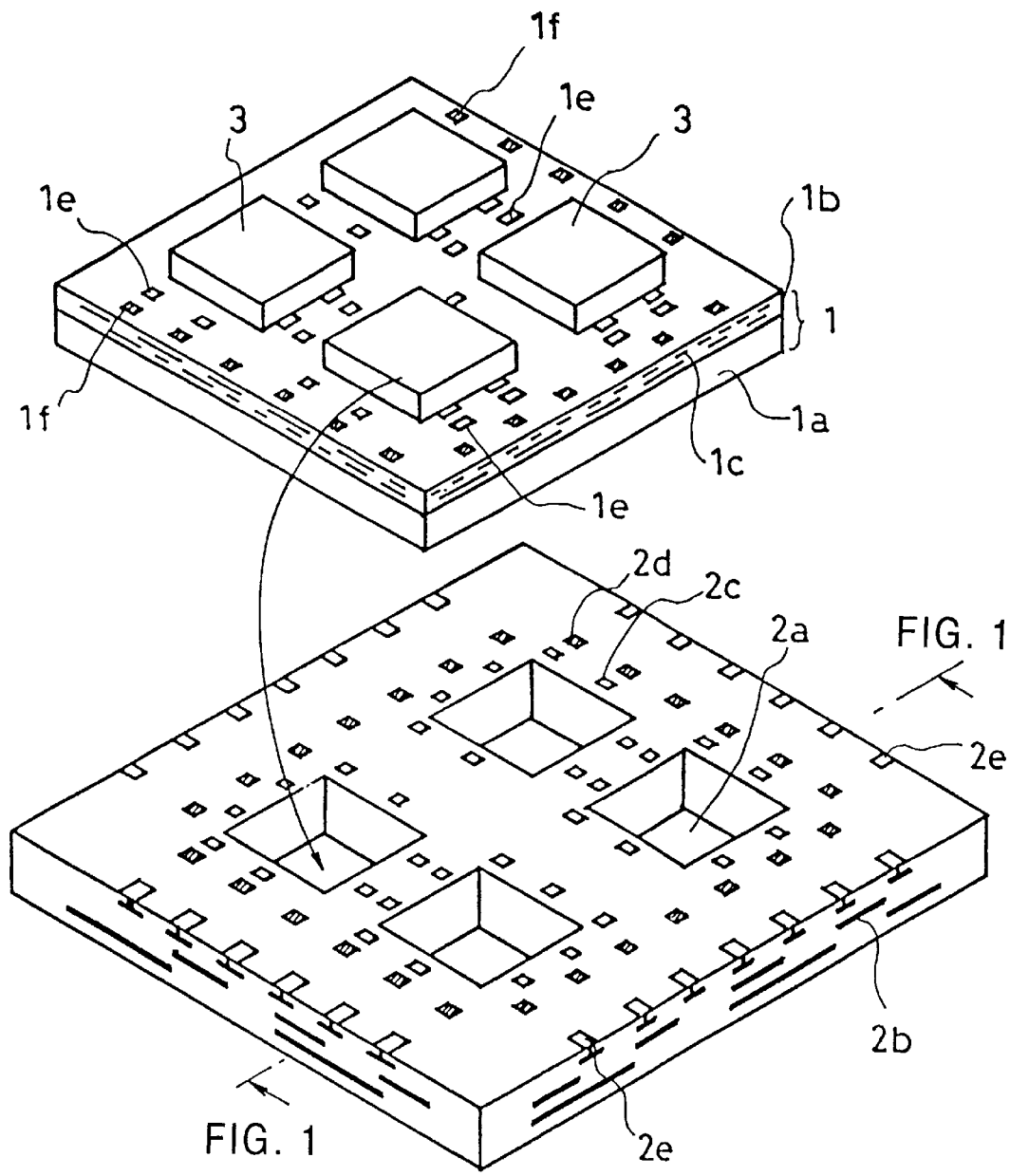
FIG. 2 is an exploded perspective view of the semiconductor device according to Embodiment 1.

FIG. 1 is a sectional view of a semiconductor device constructed as an integrated unit according to Embodiment 1 of the present invention taken on line A—A of FIG. 2. FIG. 2 is an exploded perspective view of the semiconductor device of Embodiment 1. In FIG. 2, the semiconductor device comprises a signal transmission substrate 1, a feeder substrate 2 and semiconductor elements 3. The signal transmission substrate 1 comprises a base 1a and a wiring layer 1b having a fine wiring pattern and formed on the base 1a by thin film formation technology. In concrete terms, the base 1a is made of a material having a thermal expansion coefficient approximate to that of the semiconductor element 3. Since the semiconductor element 3 has generally a thermal expansion coefficient of 3.5 or so, silicon (with thermal expansion coefficient of 3.5), silicon carbide (3.5) or aluminum nitrite (5.7) is used as the material of the base 1a. The wiring layer 1b is formed as a multi-layer by coating the base 1a with polyimide, for example, by spin coating, baking the coating film at 350° C. to form a polyimide insulator, then forming a conductive film made of a metal such as copper on this insulator by sputtering and a resist film on this conductive film, patterning the resist film by photoengraving technology, depositing copper by electroplating, etching unnecessary portions of the conductive film to form a conductive pattern 1c having a predetermined fine wiring pattern on the insulator, coating the insulator including this conductive pattern 1c with polyimide, forming openings by photoengraving technology, baking the polyimide, and forming a conductive pattern 1c again by patterning and etching in the same manner as described above. In other words, the wiring layer 1b is a multi-layer formed by repeating the formation of the insulator and the conductive pattern 1c. On the front face of this wiring layer 1b where the semiconductor elements are located, there are provided element electrodes 1d (see FIG. 1), feeder electrodes 1e, and inter-substrate input/output electrodes 1f. The element electrodes 1d, the feeder electrodes 1e and the inter-substrate input/output electrodes 1f are formed of the conductive pattern 1c of the surface layer constituting the front face of the wiring layer 1b where the semiconductor elements are located. The feeder electrodes 1e and the inter-substrate input/output electrodes 1f are electrodes provided on the signal transmission substrate 1, for electrically connecting the signal transmission substrate 1 and the feeder substrate 2. Although the element electrodes 1d are not shown in FIG. 2 because they are present immediately below the semiconductor elements 3, the feeder electrodes 1e are arranged around the semiconductor elements 3 and the inter-substrate input/output electrodes 1f are arranged near the edges of the wiring layer 1b. In this Embodiment 1, the insulator is made of polyimide, but may be made of an epoxy-base polymer resin or inorganic material such as silicon dioxide. The conductive film is formed by sputtering, but may be formed by plating. Copper is used as the material of the conductive pattern 1c, but aluminum may be used instead.

The feeder substrate 2 is formed of a ceramic laminate having open containers 2a which penetrate both surfaces of the feeder substrate 2 as the container for containing the semiconductor elements 3 disposed on the signal transmission substrate 1. In concrete terms, the feeder substrate 2 is a ceramic laminate prepared by punching a green sheet which is an unbaked ceramic sheet for forming an insulator to form the open containers 2a on the green sheet, patterning a conductive paste on this green sheet by printing, forming a conductor 2b having a predetermined wiring pattern on the green sheet, placing another green sheet having the open containers 2a on this conductor 2b, patterning a conductor 2b having a predetermined thick wiring pattern with small resistance on this green sheet to produce a multi-layer, and baking the multi-layer. In other words, the feeder substrate 2 is a ceramic laminate formed by repeating the formation of the green sheet having the open containers 2a and the conductive pattern 2b to produce a multi-layer having the thick conductive pattern 2b with small resistance, and baking the multi-layer. On the front face of the feeder substrate 2 which faces the signal transmission substrate, there are provided feeder electrodes 2c, inter-substrate input/output electrodes 2d and external input/output terminals 2e. The feeder electrodes 2c, the inter-substrate input/output substrates 2d and the external input/output terminals 2e are formed of the conductive pattern 2b of the top layer constituting the front face of the feeder substrate 2 which faces the signal transmission substrate. The feeder electrodes 2c are arranged around the open containers 2a, the inter-substrate input/output electrodes 2d are arranged outside the feeder electrodes 2c, and the external input/output terminals 2e are arranged near the edges of the feeder substrate 2 so that, when the signal transmission substrate 1 is superposed upon the feeder substrate 2, by which the semiconductor elements 3 disposed on the signal transmission substrate 1 are contained in the open containers 2a, the feeder electrodes 2c face the feeder electrodes 1e of the signal transmission substrate 1, the inter-substrate input/output electrodes 2d face the inter-substrate input/output electrodes 1f of the signal transmission substrate 1, and the external input/output terminals 2e are exposed the outside of the signal transmission substrate 1. The feeder electrodes 2c and the inter-substrate input/output electrodes 2d are electrical connection electrodes provided on the feeder substrate 2, for electrically connecting the signal transmission substrate 1 and the feeder substrate 2. In this Embodiment 1, a ceramic laminate is used as the feeder substrate 2, but a printed circuit board may be used instead.

The semiconductor element 3 is a bare chip which is cut away from a wafer subjected to a physical element formation process, is provided with electrical connection electrodes 3a (see FIG. 1) for signal transmission and power supply on the front face thereof facing the signal transmission substrate, is verified as satisfactory in a burn-in test, and is capable of high-speed signal processing like an LSI, for example. The semiconductor elements 3 are mounted on the wiring layer 1b of the signal transmission substrate 1. The signal transmission substrate 1 mounting the semiconductor elements 3 is turned upside down as shown by an arrow in FIG. 2, and the wiring layer 1b of the signal transmission substrate 1 is superposed upon and bonded to the feeder substrate 2, by which the semiconductor elements 3 are contained in the open containers 2a, to construct a semiconductor device as an integrated unit.

In concrete terms, as shown in FIG. 1, after the electrical connection electrodes 3a of the semiconductor elements 3 are bonded to the element electrodes 1d of the signal transmission substrate 1 with solder 4 and the semiconductor elements 3 are mounted on the signal transmission substrate 1, the signal transmission substrate 1 is superposed upon the feeder substrate 2, by which the semiconductor elements 3 are contained in the open containers 2a, and the feeder electrodes 1e and inter-substrate input/output electrodes 1f of the signal transmission substrate 1 are bonded to the feeder electrodes 2c and inter-substrate input/output electrodes 2d of the feeder substrate 2 with the solder 4 to construct a semiconductor device as an integrated unit. The solder 4 is used to bond the semiconductor elements 3 to the signal transmission substrate 1, but the surfaces of the electrical connection electrodes 3a of the semiconductor elements 3 and the surfaces of the element electrodes 1d of the signal transmission substrate 1 are plated with gold and bonded to each other by gold-to-gold thermal diffusion.

Therefore, according to the semiconductor device of this Embodiment 1, as shown in FIG. 1, since the signal transmission substrate 1 and the feeder substrate 2 are superposed upon and bonded to each other, and the semiconductor elements 3 bonded to the signal transmission substrate 1 are contained in the open containers 2a of the feeder substrate 2 so that the thickness of the semiconductor device is substantially the total of the thickness of the signal transmission substrate 1 and the thickness of the feeder substrate 2, thereby making it possible to produce a thin semiconductor device. Furthermore, since the wiring layer 1b is formed at areas facing the semiconductor elements 3, the area of the signal transmission substrate 1 can be reduced by locating the conductive pattern 1c constituting a fine wiring pattern at the areas facing the semiconductor elements 3 of the wiring layer 1b, thereby making it possible to produce a thin semiconductor device. In addition, since the electrical connection electrodes 3a are bonded to the element electrodes 1d facing the semiconductor elements 3 mounted on the wiring layer 1b, the length of a signal passage between adjacent semiconductor elements inevitably becomes short and signal processing speed can be accelerated. This effect is defined in claim 1.

In addition, according to the semiconductor device of this Embodiment 1, since the open containers 2a are open on the back face of the feeder substrate 2 which does not face the signal transmission substrate 1 when the signal transmission substrate 1 and the feeder substrate 2 are superposed upon and bonded to each other, heat generated from the semiconductor elements 3 is radiated from the open container 2a to the outside of the back face of the feeder substrate 2 during the operation of the semiconductor elements 1, thereby enhancing the heat radiation property of the semiconductor elements 3 without providing a heat radiation fin. This effect is defined in claim 2.

Furthermore, according to the semiconductor device of this Embodiment 1, it is possible to provide a low-cost semiconductor device since the heat radiation fin is not provided.

Furthermore, according to the semiconductor device of this Embodiment 1, since the base 1a is composed of a material having a thermal expansion coefficient approximate to that of the semiconductor element 3, such as silicon, silicon carbide and aluminum nitrite, the base 1a supports the wiring layer 1b as an inseparable unit, and even if the solder 4 is used to bond the electrical connection electrodes 3a of the semiconductor elements 3 to the element electrodes 1d of the wiring layer 1b, thermal stress causing the generation of cracking is not applied to the solder 4, thereby making it possible to secure electrical connection between the electrical connection electrodes 3a of the semiconductor elements 3 and the element electrodes 1d of the wiring layer 1b. This effect is defined in claim 3.

Embodiment 2

Figure 3:
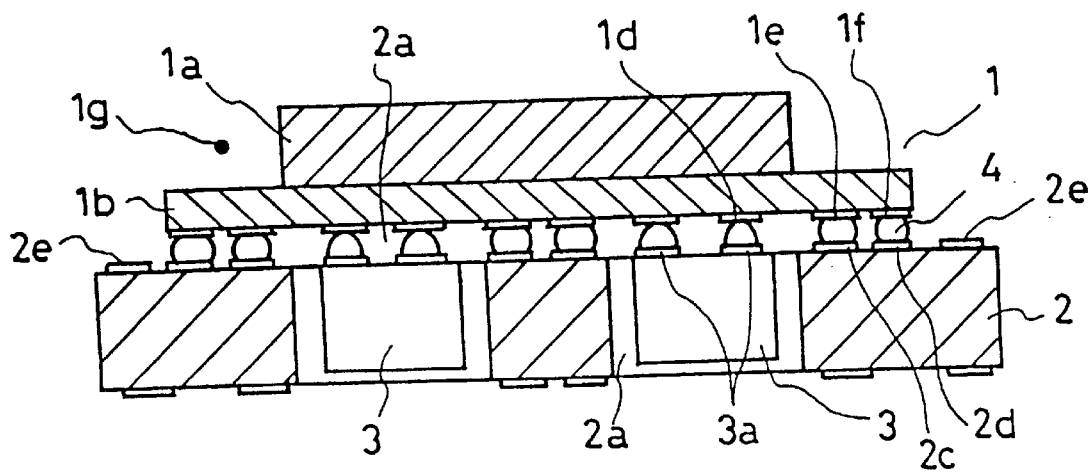
FIG. 3 is a sectional view of a semiconductor device according to Embodiment 2.

FIG. 3 is a sectional view of a semiconductor device according to Embodiment 2 of the present invention. In FIG. 3, the semiconductor device comprises a signal transmission substrate 1, a feeder substrate, and semiconductor elements 3. The feeder substrate 2 is composed of a ceramic laminate provided with open containers 2a and has feeder electrodes 2c, inter-substrate input/output electrodes 2d and external input/output terminals 2e on the front face thereof facing the signal transmission substrate. The signal transmission substrate 1 comprises a base 1a and a wiring layer 1b having a fine wiring pattern and formed on the base 1a by thin film formation technology. The wiring layer 1b is composed of a multi-layer comprising an insulator made of polyimide or an epoxy-based polymer material and a conductive pattern 1c (see FIG. 2). The wiring layer 1b has element electrodes 1d, feeder electrodes 1e and inter-substrate input/output electrodes 1f on the front face thereof where the semiconductor elements are located. In the signal transmission substrate 1, portions of the base 1a which are electrically connected with the feeder substrate 2 are removed. The removed portions of the base 1a are denoted at 1g. The removed portions 1g are formed by covering portions of the base 1a other than portions connected with the feeder substrate 2 with a resist and etching exposed portions of the base 1a to remove the resist. In this etching process, when the base 1a is made of a ferroalloy so called covar, ferric chloride and hydrochloric acid may be used, when the base 1a is made of alumina, phosphoric acid may be used, and when the base 1a is made of silicon, a mixture of nitric acid and hydrofluoric acid may be used. The removed portions 1g are formed at portions of the base 1a corresponding to the feeder electrodes 1e and inter-substrate input/output electrodes 1f, and locates the base 1a at a position corresponding to the open containers 2a.

Therefore, according to the semiconductor device of this Embodiment 2, the wiring layer 1b is composed of a multi-layer comprising an insulator made of a polymer material and a conductor, and, as shown in FIG. 3, the base 1a of the signal transmission substrate 1 has the removed portions 1g at positions corresponding to the feeder electrodes 1e and the inter-substrate input/output electrodes 1e. Therefore, when the feeder electrodes 1e and inter-substrate input/output electrodes 1f of the signal transmission substrate 1 are bonded to the feeder electrodes 2c and inter-substrate input/output electrodes 2e of the feeder substrate 2 with solder 4, the wiring layer 1b corresponding to the removed portion 1g is displaced along the uneven surface of the feeder substrate 1 on the signal transmission substrate side, and bonded to the feeder electrodes 2c and the inter-substrate input/output electrodes 2d with the solder 4 provided between the feeder electrodes 1e and the feeder electrodes 2c and between the inter-substrate input/output electrodes 1f and the inter-substrate input/output electrodes 2d, thereby enhancing the reliability of electrical connection.

As in the above-described Embodiment 1, in this Embodiment 2, the electrical connection electrodes 3a of the semiconductor elements 3 are bonded to the element electrodes 1d of the signal transmission substrate 1 with the solder 4, the signal transmission substrate 1 and the feeder substrate 2 are superposed upon each other, by which the semiconductor elements 3 are contained in the open containers 2a of the feeder substrate 2, and the feeder electrodes 1e and the inter-substrate input/output electrodes 1f of the signal transmission substrate 1 are bonded to the feeder electrodes 2c and the inter-substrate input/output electrodes 2d of the feeder substrate 2 with the solder 4 to construct a semiconductor device as an integrated unit.

Embodiment 3

Figure 4:
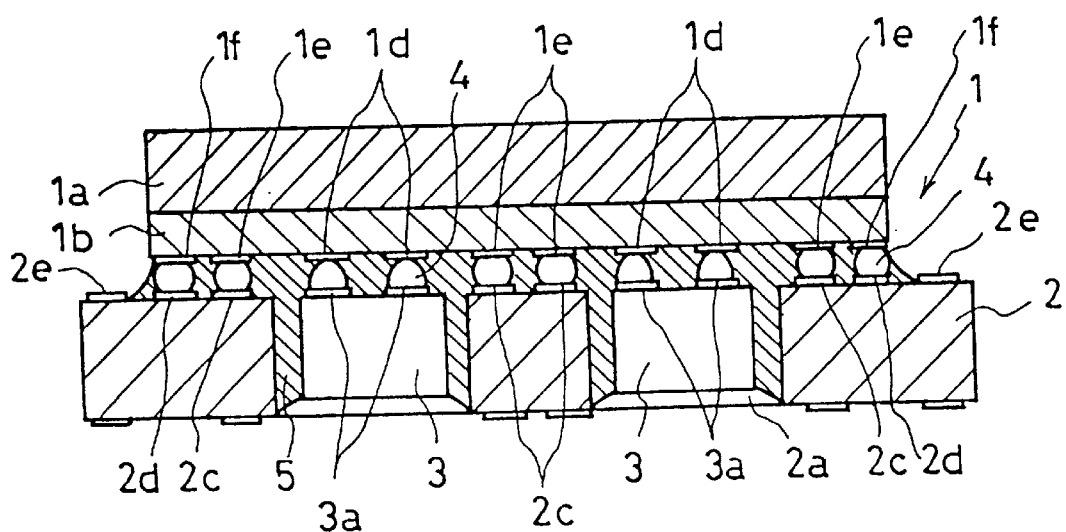
FIG. 4 is a sectional view of a semiconductor device according to Embodiment 3.

FIG. 4 is a sectional view of a semiconductor device according to Embodiment 3 of the present invention. In FIG. 4, the semiconductor device comprises a signal transmission substrate 1, a feeder substrate 2 and semiconductor elements 3. The feeder substrate 2 is formed of a ceramic laminate provided with open containers 2a, and has feeder electrodes 2c, inter-substrate input/output electrodes 2d and external input/output terminals 2e on the front face thereof facing the signal transmission substrate. The signal transmission substrate 1 has a wiring layer 1b having a fine wiring pattern and formed on a base 1a by thin film formation technology. The wiring layer 1b has element electrodes 1d, feeder electrodes 1e and inter-substrate input/output electrodes 1f on the front face thereof where the semiconductor elements are located, and the open containers 2a are filled with a polymer resin 5 which is solidified while the semiconductor elements 3 are present in the open containers 2a. This polymer resin 5 is an epoxy or silicone-based resin. In concrete terms, the electrical connection electrodes 3a of the semiconductor elements 3 are bonded to the element electrodes 1d of the signal transmission substrate 1 with solder 4, the signal transmission substrate 1 and the feeder substrate 2 are superposed upon each other, by which the semiconductor elements 3 are contained in the open containers 2a, and the molten polymer resin 5 is charged into the open containers 2a from the back face of the feeder substrate 1 until the resin becomes level with the edges of the containers and solidified while the feeder electrodes 1e and inter-substrate input/output electrodes 1f of the signal transmission substrate 1 are bonded to the feeder electrodes 2c and inter-substrate input/output electrodes 2d of the feeder substrate 2 with the solder 4. When the polymer resin 5 is charged into the open containers 2a, it flows into the gap between the semiconductor element 3 and the side walls of the open container 2a, the gap between the semiconductor element 3 and the signal transmission substrate 1 and the gap between the signal transmission substrate 1 and the feeder substrate 2. In this case, the polymer resin flowing into the gap between the signal transmission substrate 1 and the feeder substrate 2 is stopped at the outer periphery of the gap by the effect of surface tension caused by the tenacity of the polymer resin 5 and solidified.

Therefore, according to the semiconductor device of this Embodiment 3, after the semiconductor elements 3 are contained in the open containers 2a, the polymer resin 5 is poured into the open containers 2a so that the areas around the connection between the semiconductor element 3 and the signal transmission substrate 1 and around the connection between the signal transmission substrate 1 and the feeder substrate 2 are filled with the polymer resin 5, thereby making it possible to prevent water from entering the connection between the semiconductor element 3 and the signal transmission substrate 1 and the connection between the signal transmission substrate 1 and the feeder substrate 2. In addition, when the solder 4 is used to bond the semiconductor element 3 to the signal transmission substrate 1 and the signal transmission substrate 1 to the feeder substrate 2, the polymer resin 5 charged into the areas around the connection between the semiconductor element 3 and the signal transmission substrate 1 and around the connection between the signal transmission substrate 1 and the feeder substrate 2 alleviates thermal stress causing the generation of cracking in the solder 4, thereby making it possible to secure electrical connection between the semiconductor element 3 and the signal transmission substrate 1 and electrical connection between the signal transmission substrate 1 and the feeder substrate 2.

Embodiment 4

Figure 5:
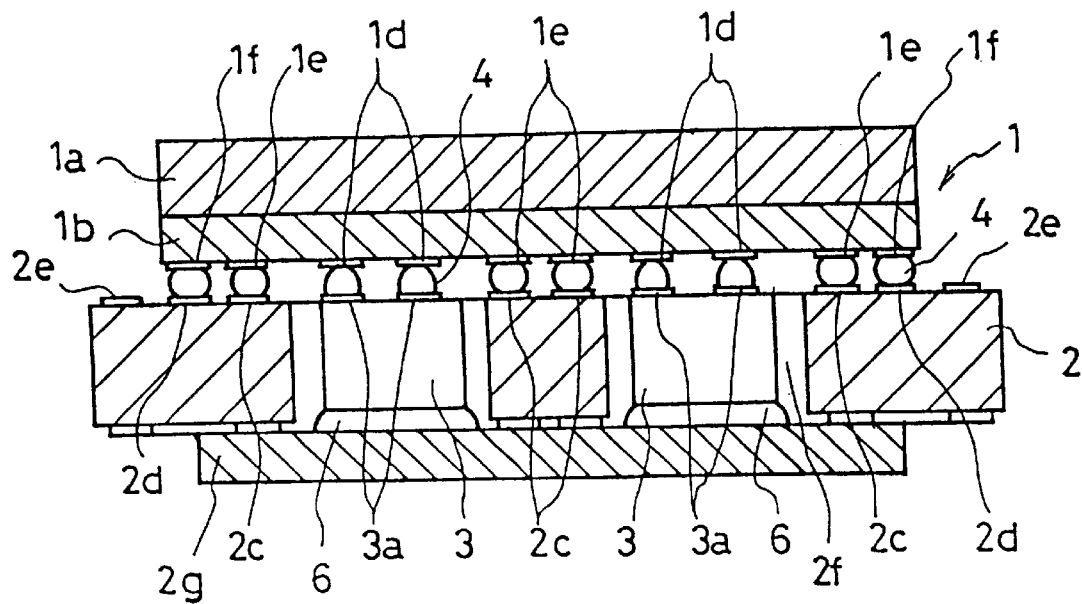
FIG. 5 is a sectional view of a semiconductor device according to Embodiment 4.

FIG. 5 is a sectional view of a semiconductor device according to Embodiment 4 of the present invention. In FIG. 5, the semiconductor device comprises a signal transmission substrate 1, a feeder substrate 2 and semiconductor elements 3. The signal transmission substrate 1 comprises a wiring layer 1b having a fine wiring pattern and formed on a base 1a by thin film formation technology. The wiring layer 1b has element electrodes 1d, feeder electrodes 1e and inter-substrate input/output electrodes 1e on the front face thereof where the semiconductor elements are located. The feeder substrate 2 has feeder electrodes 2c, inter-substrate input/output electrodes 2d and external input/output terminals 2e on the front face thereof facing the signal transmission substrate. This feeder substrate 2 has hollow containers 2f for containing the semiconductor elements 3. This hollow container 2f is open on the front side of the feeder substrate 2 which faces the signal transmission substrate and closed on the opposite side. When a ceramic laminate composed of green sheets is used as the feeder substrate 2, the hollow containers 2f are formed before baking the ceramic laminate. In concrete terms, the opening of the hollow container 2f is not formed on the green sheet of the bottom layer of the feeder substrate 2, but on the green sheet of the top layer of the feeder substrate 2 so that the hollow container 2f is open on the front side of the feeder substrate 2 which faces the signal transmission substrate and closed on the opposite side. Or, the opening of the hollow container is formed on the ceramic laminate or all of the green sheets before baking and is sealed with a flat sheet 2g bonded to the back face of the feeder substrate 2 so that the hollow container 2f is open on the front side of the feeder substrate 2 which faces the signal transmission substrate and closed on the opposite side. When a printed circuit board is used as the feeder substrate 2, the opening of the hollow container 2f is formed on the printed circuit board and is sealed with a flat sheet corresponding to the above-mentioned flat sheet 2g bonded to the back face of the printed circuit board. To this bottom surface of this hollow container 2f, the surface of the semiconductor element 3 contained in the hollow container 2f opposite to the surface where the electrical connection electrode 3a of the semiconductor element 3 are provided is bonded with an adhesive 6. A mixture of an epoxy resin and a silver filler having good thermal conductivity is used as the adhesive 6.

Therefore, according to the semiconductor device of this Embodiment 4, since the semiconductor elements 3 are contained in the hollow containers 2f formed on the feeder substrate 2 and the electrical connection electrodes 3a of the semiconductor element 3 are bonded with the solder 4 to the element electrodes 1d of the signal transmission substrate 1 bonded to and superposed upon the feeder substrate 2 in the hollow container 2f, the semiconductor element 3 can be sealed with the side wall surfaces and the bottom surface of the hollow container 2f and the signal transmission substrate 1. The bowl-like sealing cap of the prior art is not required for sealing the semiconductor element 3, thereby making it possible to reduce costs. In addition, since heat generated from the semiconductor element 3 is radiated from the bottom surface of the hollow container 2f to the outside of the back face of the feeder substrate 2 during the operation of the semiconductor element 3, the heat radiation property of the semiconductor element 3 can be enhanced without providing the heat radiation fin. Furthermore, it is possible to provide a low-cost semiconductor device since the heat radiation fin is not provided. In addition, when the semiconductor element 3 is bonded to the flat sheet 2g constituting the bottom surface of the hollow container 2f with the heat conductive adhesive 6, heat generated from the semiconductor element 3 is transmitted quickly from the adhesive 6 to the flat sheet 2g, thereby making it possible to radiate heat efficiently.

Embodiment 5

Figure 6:
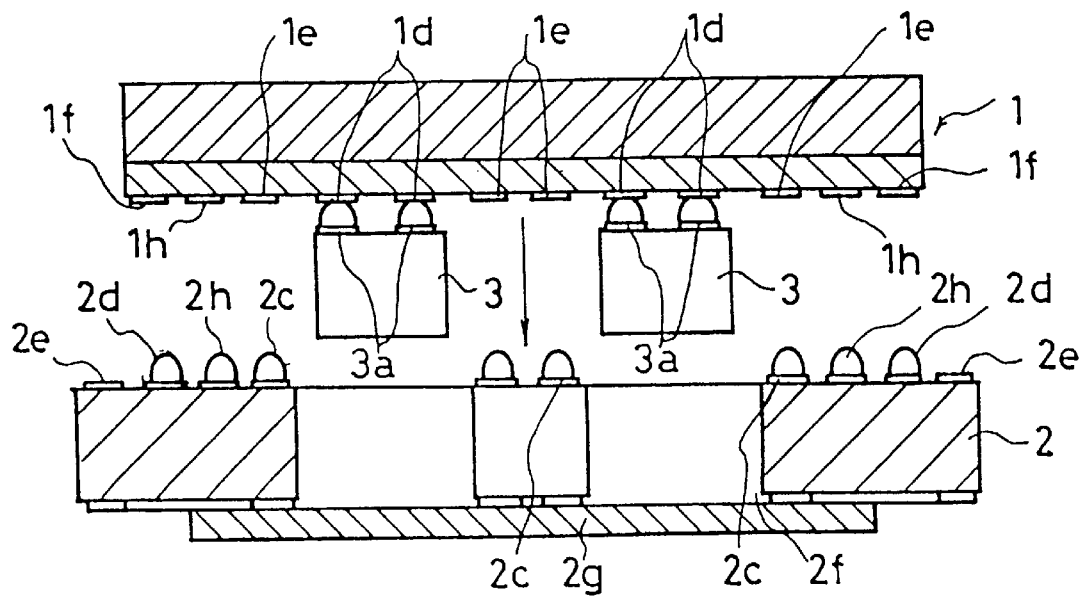
FIG. 6 is a sectional view of a semiconductor device according to Embodiment 5.

FIG. 6 is a sectional view of a semiconductor device in process of production by means of a production method according to Embodiment 5 of the present invention. In FIG. 6, the semiconductor device comprises a signal transmission substrate 1, a feeder substrate 2 and semiconductor elements 3. The signal transmission substrate 1 comprises a wiring layer 1b having a fine wiring pattern and formed on a base 1a by thin film formation technology. The wiring layer 1b has element electrodes 1d, feeder electrodes 1e, inter-substrate input/output electrodes 1f and sealing pads 1h on the front face thereof where the semiconductor elements are located. The sealing pads 1h located between the feeder electrodes 1e and the inter-substrate input/output electrodes 1f are shifted in the circumferential direction of the semiconductor element 3 so that they are not aligned with the feeder electrodes 1e and the inter-substrate input/output electrodes 1f. The feeder substrate 2 is formed of a ceramic laminate provided with hollow containers 2f and has feeder electrodes 2c, inter-substrate input/output electrodes 2d, external input/output terminals 2e and sealing pads 2h on the front face thereof facing the signal transmission substrate. The sealing pads 2h located between the feeder electrodes 2c and the inter-substrate input/output electrodes 2d are shifted in the circumferential direction of the hollow container 2f so that they are not aligned with the feeder electrodes 2c and the inter-substrate input/output electrodes 2d. When the signal transmission substrate 1 is superposed upon the feeder substrate 2, by which the semiconductor elements 3 located on the signal transmission substrate 1 are contained in the hollow containers 2a, the sealing pads 2h and the sealing pads 1h face each other. These sealing pads 1h and 2h are formed simultaneously with the formation of the conductive pattern 1c (see FIG. 2). These sealing pads 1h and 2h are electrically isolated from the feeder electrodes 1e, the inter-substrate input/output electrodes 1f, the feeder electrodes 2c, and the inter-substrate input/output electrodes 2d.

In concrete terms, in this Embodiment 5, the semiconductor device is formed as an integrated unit by (1) bonding the electrical connection electrodes 3a of the semiconductor element 3 to the element electrodes 1d of the signal transmission substrate 1 with solder 4, (2) mounting the semiconductor elements 3 on the signal transmission substrate 1, (3) attaching the solder 4 upon the feeder electrodes 2c, the inter-substrate input/output electrodes 2d and the sealing pads 2h, (4) positioning the signal transmission substrate 1 and the feeder substrate 2 in parallel to face each other so that the semiconductor element 3 faces the opening of the hollow container 2f, as shown in FIG. 6, (5) moving the signal transmission substrate 1 toward the feeder substrate 2 as shown by the arrow, (6) containing the semiconductor elements 3 in the hollow containers 2f, (7) superposing the signal transmission substrate 1 upon the feeder substrate 2, (8) mounting the feeder electrodes 1e, inter-substrate input/output electrodes 1f and sealing pads 1h of the signal transmission substrate 1 on the solder 4 placed upon the feeder electrodes 2c, inter-substrate input/output electrodes 2d and sealing pads 2h of the feeder substrate 2, respectively, and (9) melting and solidifying the solder 4 to bond the feeder electrodes 1e, inter-substrate input/output electrodes 1f and sealing pads 1h of the signal transmission substrate 1 to the feeder electrodes 2c, inter-substrate input/output electrodes 2d and sealing pads 2h of the feeder substrate 2 with the solder 4 at the same time, respectively.

In short, according to the method for producing a semiconductor device of this Embodiment 5, since the feeder electrodes 1e, inter-substrate input/output electrodes 1f and sealing pads 1h of the signal transmission substrate 1 are bonded to the feeder electrodes 2c, inter-substrate input/output electrodes 2d and sealing pads 2h of the feeder substrate 2 with the solder 4 at the same time, respectively, the number of production processes can be reduced. In this Embodiment 5, the feeder substrate 2 is located below the signal transmission substrate 2 and the solder 4 is placed on the side of the feeder substrate 2, as described above and illustrated in the figure, but the same effect can be obtained by locating the signal transmission substrate 1 below the feeder substrate 2 and attaching the solder on the side of the signal transmission substrate 1. In addition, in this Embodiment 5, the container for containing the semiconductor element 3 is the hollow container 2f, as described above and illustrated in the figure, but the same effect can be obtained by forming the open container 2a as illustrated in FIG. 1 as the container for containing the semiconductor element 3.

Embodiment 6

Figure 7:
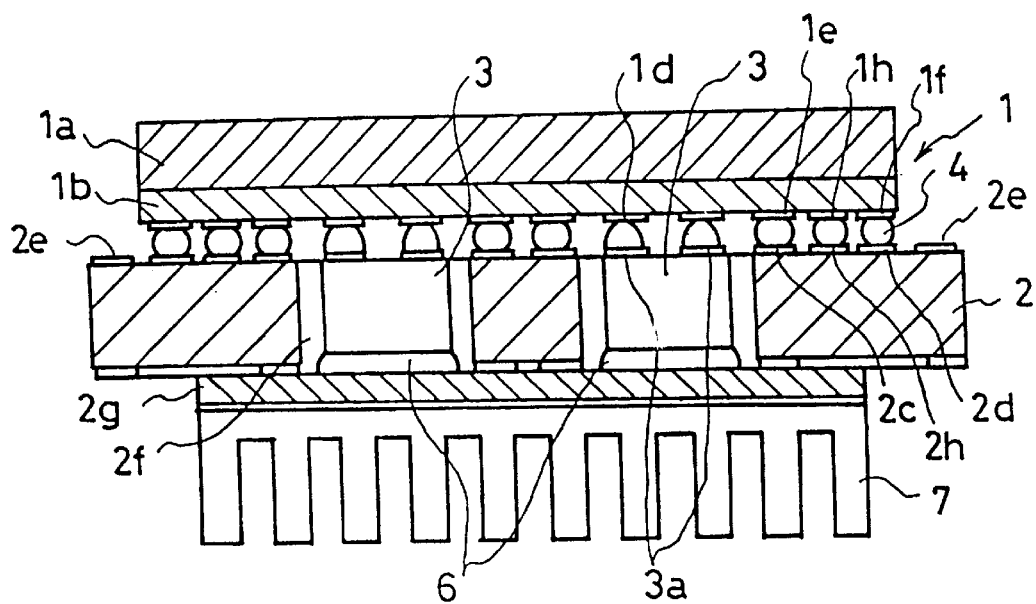
FIG. 7 is a sectional view of a semiconductor device according to Embodiment 6.

FIG. 7 is a sectional view of a semiconductor device according to Embodiment 6 of the present invention. In FIG. 7, the semiconductor device comprises a signal transmission substrate 1, a feeder substrate 2, semiconductor elements 3 and a heat radiation fin 7. The signal transmission substrate 1 comprises a wiring layer 1b having a fine wiring pattern and formed on a base 1a by thin film formation technology. The wiring layer 1b has element electrodes 1d, feeder electrodes 1e, inter-substrate input/output electrodes 1f and sealing pads 1h on the front face thereof where the semiconductor elements are located. The feeder substrate 2 is formed of a ceramic laminate provided with hollow containers 2f, and has feeder electrodes 2c, inter-substrate input/output electrodes 2d, external input/output terminals 2e and sealing pads 2h on the front face thereof facing the signal transmission substrate. The bottom surface of the hollow container 2f is bonded with an adhesive 6 to the surface of the semiconductor element 3 contained in the hollow container 2f which is opposite to the surface where the electrical connection electrodes 3a are located. The heat radiation fin 7 is bonded to the back face of the flat sheet 2g constituting the bottom surface of the hollow container 2f, that is, the back face of the feeder substrate 2. This heat radiation fin 7 is composed of a heat conductive material such as aluminum and shaped like a comb having many fins. The adhesive 6 is composed of a mixture of a silver filler and an epoxy resin having good heat conductivity.

Therefore, according to the semiconductor device of this Embodiment 6, the semiconductor elements 3 are contained in the hollow containers 2f formed on the feeder substrate 2, the electrical connection electrodes 3a of the semiconductor element 3 are bonded with the solder 4 to the element electrodes 1d of the signal transmission substrate 1 superposed upon and bonded to the feeder substrate 2 in the hollow container 2f, the semiconductor element 3 is bonded to the bottom surface of the hollow container 2f with the adhesive 6 having good heat conductivity, and the heat radiation fin 7 is provided on the back face of the feeder substrate 2 including the bottom surface of the hollow container 2f for the semiconductor element 3. Therefore, heat generated from the semiconductor element 3 is transmitted quickly from the adhesive 6 to the heat radiation fin 7, thereby making it possible to radiate heat generated from the semiconductor elements 3 to the outside of the semiconductor device efficiently.

Embodiment 7

Figure 8:
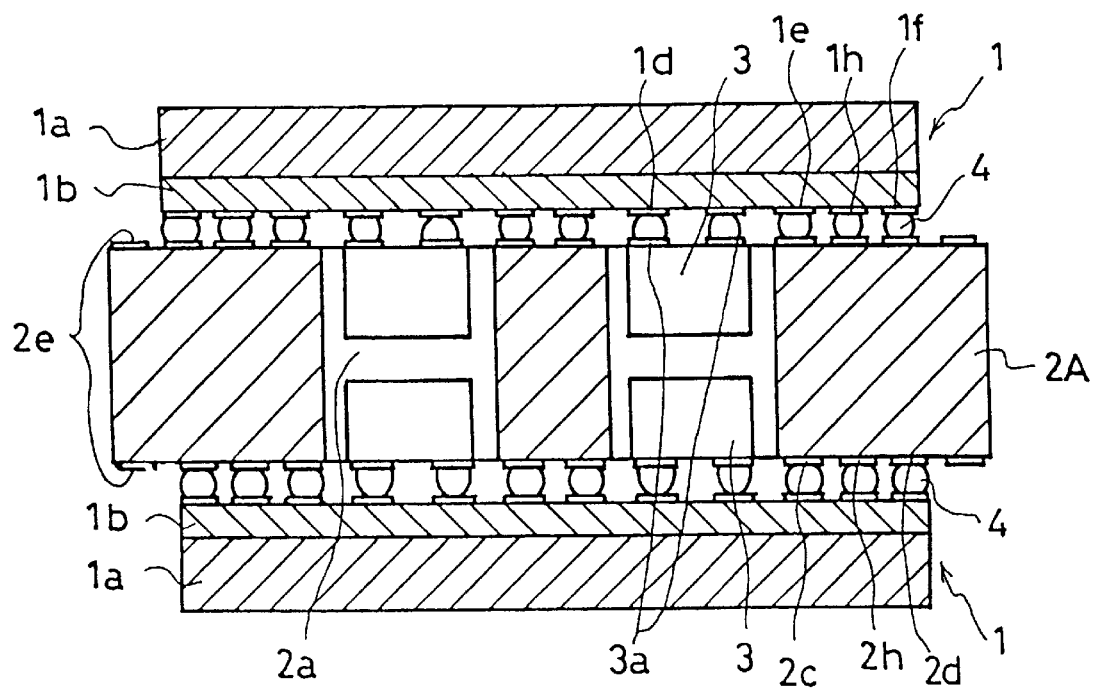
FIG. 8 is a sectional view of a semiconductor device according to Embodiment 7.

FIG. 8 is a sectional view of a semiconductor device according to Embodiment 7 of the present invention. In FIG. 8, the semiconductor device comprises signal transmission substrates 1, a feeder substrate 2A and semiconductor elements 3. The feeder substrate 2A has a thickness slightly larger than the total height of the semiconductor elements placed one upon the other back to back. The signal transmission substrate 1 having the semiconductor elements 3 bonded thereto is bonded to both sides of the feeder substrate 2A. In concrete terms, the feeder substrate 2A is formed of a ceramic laminate provided with open containers 2a, and has feeder electrodes 2c, inter-substrate input/output electrodes 2d, external input/output terminals 2e and sealing pads 2h on both surfaces. The signal transmission substrate 1 comprises a wiring layer 1b having a fine wiring pattern and formed on a base 1a, and the wiring layer 1b has element electrodes 1d, feeder electrodes 1e, inter-substrate input/ output electrodes 1f and sealing pads 1h on the front face thereof where the semiconductor elements are located. The electrical connection electrodes 3a of the semiconductor element 3 are bonded to the element electrodes 1d of the signal transmission substrate 1 with solder 4, two signal transmission substrates 1 which mount the semiconductor elements 3 are superposed upon both sides of the feeder substrate 2A, by which the semiconductor elements 3 are contained in the open containers 2a, the feeder electrodes 1e, inter-substrate input/output electrodes 1f and sealing pads 1h of the signal transmission substrate 1 are bonded to the feeder electrodes 2c, inter-substrate input/output electrodes 2d and sealing pads 2h of the feeder substrate 2A with the solder 4, respectively, thereby constructing a semiconductor device as an integrated unit. This semiconductor device is arranged such that the semiconductors 3 are contained back to back in the open containers 2a and the feeder substrate 2A having the open containers 2a is sandwiched between the two signal transmission substrates 1.

Therefore, according to the semiconductor device of this Embodiment 7, since the thick feeder substrate 2A is sandwiched between the two signal transmission substrates 1 to which the semiconductor elements 3 are bonded, the semiconductor elements 3 are contained back to back in the open containers formed on the feeder substrate 2, and the open containers 2a are sealed with the signal transmission substrates 1, the thickness of the semiconductor device does not become so large, and yet the packaging density of the semiconductor elements 3 can be doubled.

Embodiment 8

Figure 9:
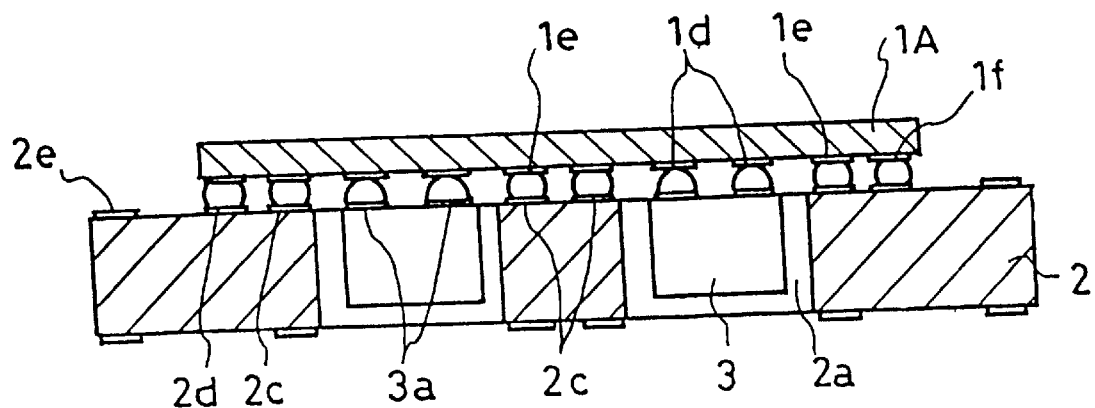
FIG. 9 is a sectional view of a semiconductor device according to Embodiment 8.

FIG. 9 is a sectional view of a semiconductor device according to Embodiment 8 of the present invention. In FIG. 9, the semiconductor device comprises a signal transmission substrate 1A, a feeder substrate 2 and semiconductor elements 3. The signal transmission substrate 1A is composed of a multi-layer comprising a polymer insulator and a metal conductor and has flexibility. In concrete terms, the signal transmission substrate 1A is formed by affixing a metal film as a conductor to one surface of a film insulator made of a polymer material, patterning the metal film with a resist, and etching the resist to form a conductive pattern having a predetermined fine wiring pattern, affixing again a film insulator made of a polymer material to one surface of the insulator comprising this conductive pattern, and forming a conductive pattern on one surface of the insulator. In this way, this process is repeated to form a multi-layer having flexibility. The signal transmission substrate 1A has element electrodes 1d, feeder electrodes 1e, and inter-substrate input/ output electrodes 1f on the front face thereof where the semiconductor elements are located. The electrical connection electrodes 3a of the semiconductor element 3 are bonded to the element electrodes 1d with solder 4. The feeder substrate 2 is formed of a ceramic laminate provided with open containers 2a and has feeder electrodes 2c, inter-substrate input/output electrodes 2d and external input/ output terminals 2e on the front face thereof facing the signal transmission substrate. The signal transmission substrate 1 which mounts the semiconductor elements 3 is superposed upon the feeder substrate 2, by which the semiconductor elements 3 are contained in the open containers 2a, and the feeder electrodes 1e and inter-substrate input/output electrodes 1f of the signal transmission substrate 1 are bonded to the feeder electrodes 2c and inter-substrate input/output electrodes 2d of the feeder substrate 2 with the solder 4, respectively, thereby constructing a semiconductor device as an integrated unit.

Therefore, according to the semiconductor device of this Embodiment 8, since the signal transmission substrate 1 has flexibility because it is composed of a film insulator made of a polymer material and a metal film, when the signal transmission substrate 1 is bonded to the feeder substrate 2 with the solder 4 while the semiconductor elements 3 are contained in the open containers 2a, the signal transmission substrate 1 is transformed along the uneven surface of the feeder substrate 2 on the signal transmission substrate side thereof, and the feeder electrodes 1e and the inter-substrate input/output electrodes 1f are bonded to the feeder electrodes 2c and the inter-substrate input/output electrodes 2d with the solder 4 therebetween, respectively, thereby making it possible to enhance the reliability of electrical connection. In addition, since, when the signal transmission substrate 1 is bonded to the feeder substrate 2 while the semiconductor elements 1 are contained in the open containers 2a, the signal transmission substrate 1 has flexibility, even if the solder 4 is used to bond the electrical connection electrodes 3a of the semiconductor element 3 to the element electrodes 1d of the signal transmission substrate 1, the signal transmission substrate 1 absorbs thermal stress causing the generation of cracking in the solder 4, thereby making it possible to secure electrical connection between the semiconductor element 3 and the signal transmission substrate 1 as well as the useful life longevity of the semiconductor elements 3, and to electrically connect a future semiconductor element having a large number of input/output electrodes.

In this Embodiment 8, the signal transmission substrate 1 is formed by affixing a metal film to a film insulator made of a polymer material, but a metal thin film may be formed on the film insulator made of a polymer material by sputtering or plating. The same effect can be obtained by using polyimide or an epoxy resin as the polymer material.

Embodiment 9

Figure 10:
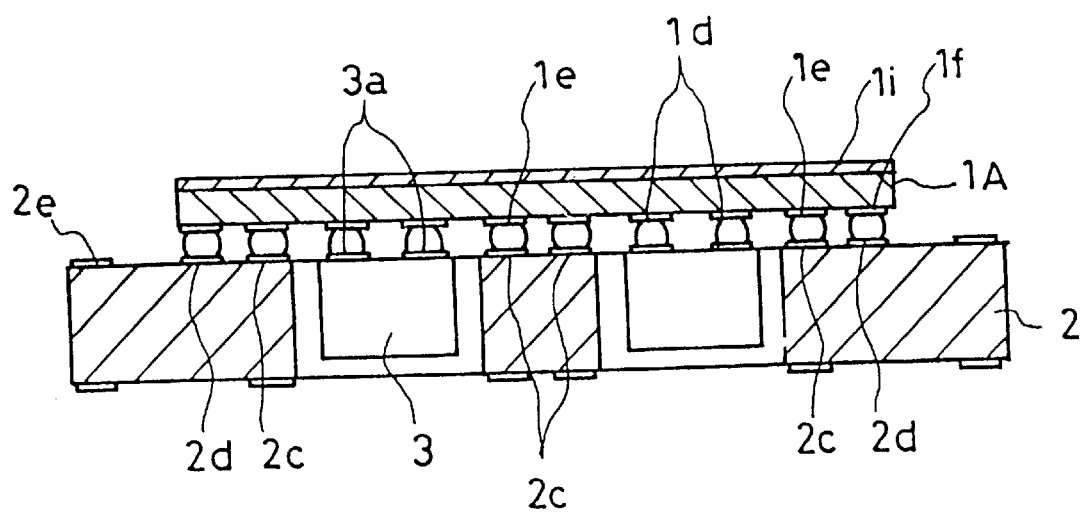
FIG. 10 is a sectional view of a semiconductor device according to Embodiment 9.

FIG. 10 is a sectional view of a semiconductor device according to Embodiment 9 of the present invention. In FIG. 10, the semiconductor device comprises a signal transmission substrate 1A, a feeder substrate 2 and semiconductor elements 3. The signal transmission substrate 1A has flexibility because it is composed of a multi-layer comprising an insulator made of a polymer material and a metal conductor, and has a metal film 1i formed by sputtering or plating on the back face thereof which is opposite to the surface of the feeder substrate side. The signal transmission substrate 1A comprises element electrodes 1d, feeder electrodes 1e and inter-substrate input/output electrodes 1f on the front face thereof where the semiconductor elements are located. The electrical connection electrodes 3a of the semiconductor element 3 are bonded to the element electrodes 1d with solder 4. The feeder substrate 2 is formed of a ceramic laminate provided with open containers 2a and has feeder electrodes 2c, inter-substrate input/output electrodes 2d and external input/output terminals 2e on the front face thereof facing the signal transmission substrate. The signal transmission substrate 1 which mounts the semiconductor elements 3 is superposed upon the feeder substrate 2, by which the semiconductor elements 3 are contained in the open containers 2a, the feeder electrodes 1e and inter-substrate input/output electrodes 1f of the signal transmission substrate 1 are bonded to the feeder electrodes 2c and inter-substrate input/output electrodes 2d of the feeder substrate 2 with the solder 4, respectively, thereby constructing a semiconductor device as an integrated unit.

Therefore, according to the semiconductor device of this Embodiment 9, since the signal transmission substrate 1A has flexibility without a base because it is composed of an insulator and a conductor, and the metal film 1i is provided on the back face of the signal transmission substrate 1A, the metal film 1i provides an electromagnetic shield to the semiconductor wiring in the semiconductor device, making it possible to achieve a semiconductor device having high noise resistance.

In this Embodiment 9, the material of the metal film 1i may be any material having small electric resistance such as copper, gold and aluminum.

Embodiment 10

Figure 11:
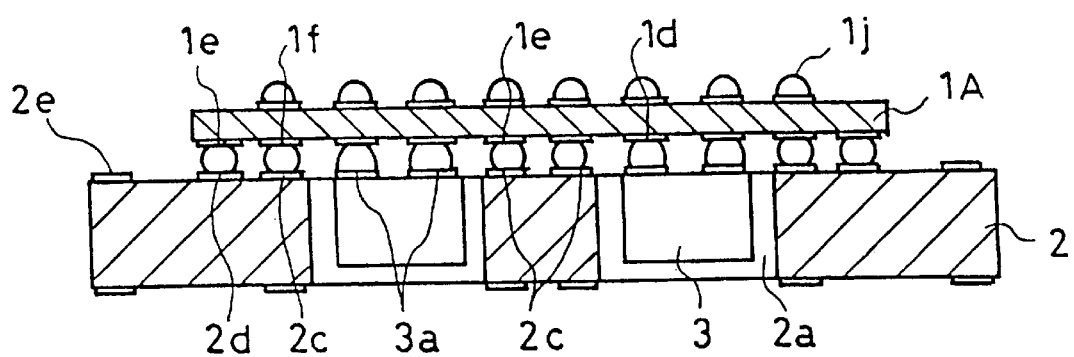
FIG. 11 is a sectional view of a semiconductor device according to Embodiment 10.

FIG. 11 is a sectional view of a semiconductor device according to Embodiment 10 of the present invention. In FIG. 11, the semiconductor device comprises a signal transmission substrate 1A, a feeder substrate 2 and semiconductor elements 3. The signal transmission substrate 1A has flexibility because it is composed of a multi-layer comprising an insulator made of a polymer material and a metal conductor and comprises input/output terminals 1j on the back face thereof. In concrete terms, the input/output terminals 1i are formed by patterning a resist on the back face of the insulator which constitutes the back face of the signal transmission substrate 1A, forming openings by reactive ion etching, wet etching or laser, and depositing a conductor in the openings by means of solder plating, or by forming openings and printing a solder paste in the openings. The signal transmission substrate 1A has element electrodes 1d, feeder electrodes 1e and inter-substrate input/output electrodes 1f on the front face thereof where the semiconductor elements are located. The electrical connection electrodes 3a of the semiconductor element 3 are bonded to the element electrodes 1d with solder 4. The feeder substrate 2 is composed of a ceramic laminate provided with open containers 2a and has feeder electrodes 2c, inter-substrate input/output electrodes 2d and external input/output terminals 2e on the front face thereof facing the signal transmission substrate. The signal transmission substrate 1 which mounts the semiconductor elements 3 is superposed upon the feeder substrate 2, by which the semiconductor elements 3 are contained in the open containers 2a, and the feeder electrodes 1e and inter-substrate input/output electrodes 1f of the signal transmission substrate 1 are bonded to the feeder electrodes 2c and inter-substrate input/output electrodes 2d of the feeder substrate 2 with the solder 4, respectively, thereby constructing a semiconductor device as an integrated unit.

Therefore, according to the semiconductor device of this Embodiment 10, since the input/output terminals 1j are provided on the back face of the signal transmission substrate 1A, when the semiconductor device is mounted on an unshown mother board, the input/output terminals 1j of the signal transmission substrate 1A are displaced along the uneven surface of the mother board, thereby making it possible to enhance the reliability of electrical connection between the input/output terminals 1j and the mother board.

Embodiment 11

Figure 12:
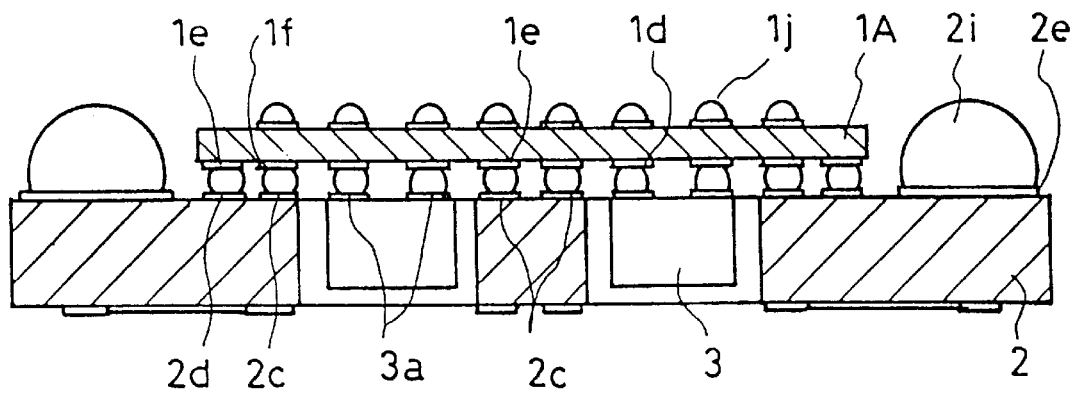
FIG. 12 is a sectional view of a semiconductor device according to Embodiment 11.

FIG. 12 is a sectional view of a semiconductor device according to Embodiment 11 of the present invention. In FIG. 12, the semiconductor device comprises a signal transmission substrate 1A, a feeder substrate 2 and semiconductor elements 3. The signal transmission substrate 1A has flexibility because it is composed of a multi-layer comprising an insulator made of a polymer material and a metal conductor, and comprises input/output terminals 1j on the back face thereof and element electrodes 1d, feeder electrodes 1e and inter-substrate input/output electrodes 1f on the front face thereof where the semiconductor elements are located. The electrical connection electrodes 3a of the semiconductor element 3 are bonded to the element electrodes 1d with solder 4. The feeder substrate 2 is formed of a ceramic laminate provided with open containers 2a and comprises feeder electrodes 2c, inter-substrate input/output electrodes 2d and external input/output terminals 2e on the front face thereof facing the signal transmission substrate. Input/output terminals 2i are formed on the external input/output terminals 2e located at the outer periphery of the feeder substrate 2 by plating or printing a solder paste on the external input/output terminals 2e. The signal transmission substrate 1A is superposed upon the feeder substrate 2, by which the semiconductor elements 3 are contained in the open containers 2a, and the feeder electrodes 1e and inter-substrate input/output electrodes 1f of the signal transmission substrate 1A are bonded to the feeder electrodes 2c and inter-substrate input/output electrodes 2d of the feeder substrate 2 with solder 4, respectively, thereby constructing a semiconductor device as an integrated unit.

Therefore, according to the semiconductor of this Embodiment 11, since the signal transmission substrate 1A has the input/output terminals 1j and the feeder substrate 2 has the input/output terminals 2i, these input/output electrodes can be divided for signal transmission and power supply applications and various-sized electrodes can be formed for each application purpose, thereby making it possible to improve the performance of the semiconductor device.

Embodiment 12

Figure 13:
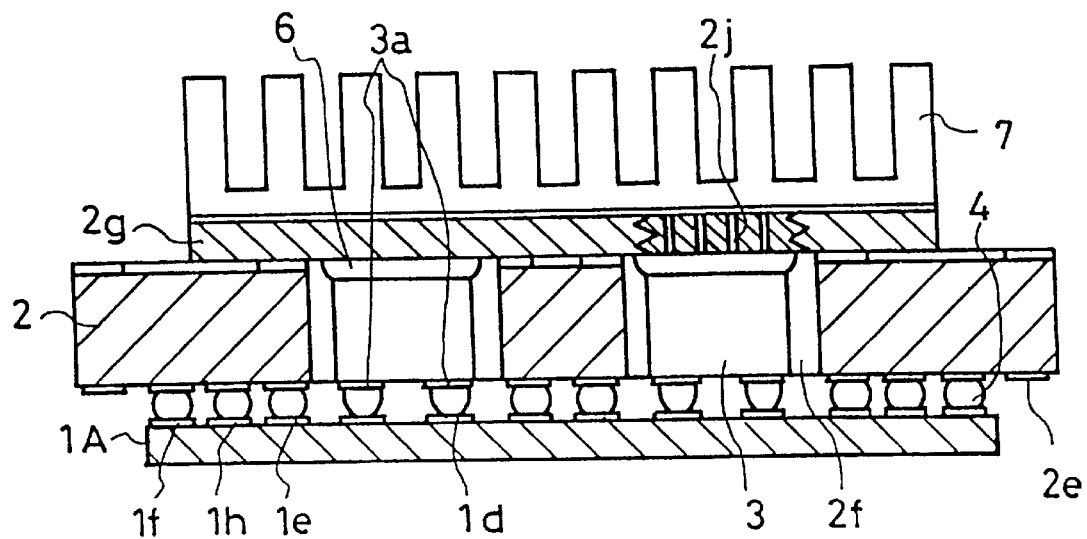
FIG. 13 is a sectional view of a semiconductor device according to Embodiment 12.

FIG. 13 is a sectional view of a semiconductor device according to Embodiment 12. In FIG. 13, the semiconductor device comprises a signal transmission substrate 1A, a feeder substrate 2, semiconductor elements 3 and a heat radiation fin 7. The signal transmission substrate 1A has flexibility because it is composed of a multi-layer comprising an insulator made of a polymer material and a metal conductor, and comprises element electrodes 1d, feeder electrodes 1e, inter-substrate input/output electrodes 1f and sealing pads 1h on the front face thereof where the semiconductor elements are located. The electrical connection electrodes 3a of the semiconductor element 3 are bonded to the element electrodes 1d with solder 4. The feeder substrate 2 comprises hollow containers 2f and has feeder electrodes 2c, inter-substrate input/output electrodes 2d, external input/output terminals 2e and sealing pads 2h on the front face thereof facing the signal transmission substrate. Pores 2j are formed in the bottom of the hollow container 2f and the semiconductors 3 mounted on the signal transmission substrate 1A are contained in the hollow containers 2f. A surface of the semiconductor element 3 opposite to the surface where the electrical connection electrodes 3a are located is bonded to the bottom surface of the hollow container 2f with an adhesive 6. The signal transmission substrate 1A is superposed upon the feeder substrate 2. The feeder electrodes 1e, inter-substrate input/output electrodes 1f and sealing pads 1h of the signal transmission substrate 1A are bonded to the feed electrodes 2c, inter-substrate input/output electrodes 2d and sealing pads 2h of the feeder substrate 2 with solder 4, respectively. The heat radiation fin 7 is bonded to the back face of a flat sheet 2g constituting the bottom of the hollow container 2f. In this way, the semiconductor device is constructed as an integrated unit. When the feeder substrate 2 is composed of a ceramic laminate of green sheets, the above-described pores 2j are formed by punching the green sheet with a needle. When the hollow containers 2f are formed on the feeder substrate 2 by bonding a flat sheet corresponding to the flat sheet 2g to the printed circuit board, the pores 2j are formed by drilling the flat sheet with a drill.

Therefore, according to the semiconductor device of this Embodiment 12, since the pores 2j are provided in the bottoms of the hollow containers 2f, when the semiconductor element 3 is bonded to the bottom surface of the hollow container 2f with the adhesive 6, the adhesive 6 enters the pores 2j and becomes thin between the semiconductor element 3 and the bottom surface of the hollow container 2f, and heat generated from the semiconductor element 3 can be radiated efficiently to the back face of the feeder substrate 2. When the heat radiation fin 7 is provided on the back face of the feeder substrate 2, since the adhesive 6 entering the pores 2j flows to the back face of the feeder substrate 2 and serves efficiently as an adhesive for bonding the heat radiation fin 7, the heat radiation fin 7 can be installed on the feeder substrate 2 efficiently.

Embodiment 13

Figure 14:
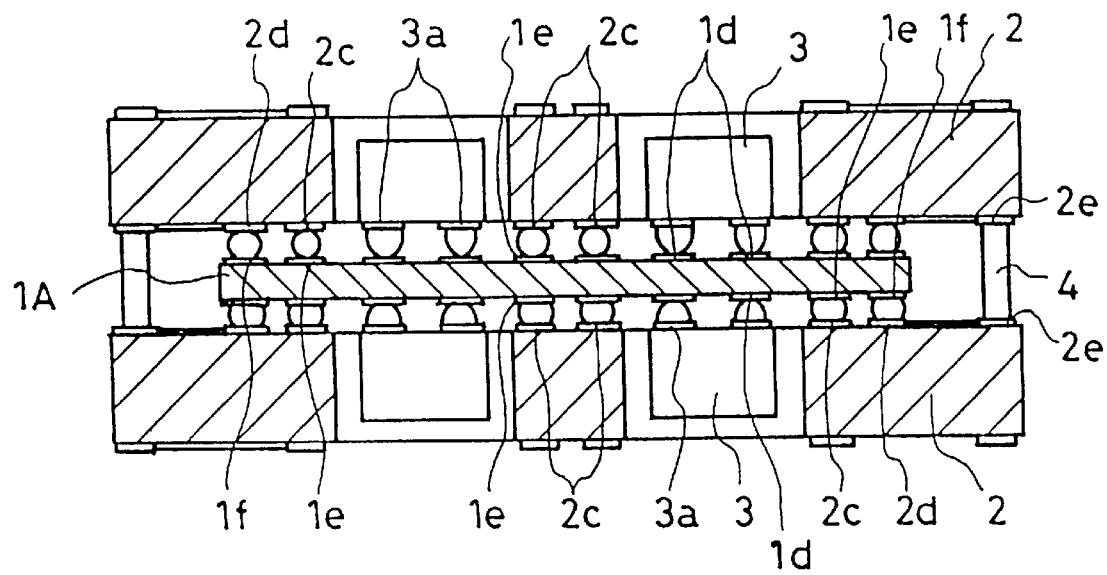
FIG. 14 is a sectional view of a semiconductor device according to Embodiment 13.

FIG. 14 is a sectional view of a semiconductor device according to Embodiment 13 of the present invention. In FIG. 14, the semiconductor device comprises a signal transmission substrate 1A, feeder substrates 2 and semiconductor elements 3. The semiconductor elements 3 are bonded to both surfaces of the signal transmission substrate 1A and the feeder substrates 2 are bonded to both surfaces of the signal transmission substrate 1A, containing the semiconductor elements 3. In concrete terms, the signal transmission substrate 1A has flexibility because it is composed of a multi-layer comprising an insulator made of a polymer material and a metal conductor, and comprises element electrodes 1d, feeder electrodes 1e and inter-substrate input/output electrodes 1f on both surfaces thereof. The electrical connection electrodes 3a of the semiconductor element 3 are bonded to the element electrodes 1d on both surfaces of the signal transmission substrate 1A with solder 4. The feeder substrate 2 is formed of a ceramic laminate provided with open containers 2a and has feeder electrodes 2c, inter-substrate input/output electrodes 2d and external input/output terminals 2e on the front face thereof facing the signal transmission substrate. Two feeder substrates 2 are superposed upon both surfaces of the signal transmission substrate 1A, by which the semiconductor elements 3 bonded to both surfaces of the signal transmission substrate 1A are contained in the open containers 2a, and the feeder electrodes 1e and inter-substrate input/output electrodes 1f of the signal transmission substrate 1A are bonded to the feeder electrodes 2c and inter-substrate input/output electrodes 2d of the feeder substrates 2 with solder 4, respectively. In this way, a semiconductor device is constructed as an integrated unit. This semiconductor device is arranged such that the semiconductor elements 3 are contained in the open containers 2a of the two feeder substrates 2 and the signal transmission substrate 1 to which the semiconductor elements 3 are bonded is sandwiched between the two feeder substrates 2. The semiconductor elements 3 may be bonded to the signal transmission substrate 1A by gold-to-gold thermal diffusion.

Therefore, according to the semiconductor device of this Embodiment 13, since the signal transmission substrate 1A comprising the insulator and the conductor is made thin, the semiconductor elements 3 are bonded to both surfaces of this thin signal transmission substrate 1A which is sandwiched between two feeder substrates 2, and the semiconductor elements 3 are contained in the open containers 2a formed on the feeder substrates 2, the thickness of the semiconductor device is increased only by the thickness of a single feeder substrate 2, and yet the packaging density of the semiconductor elements 3 can be doubled.

Figure 15:
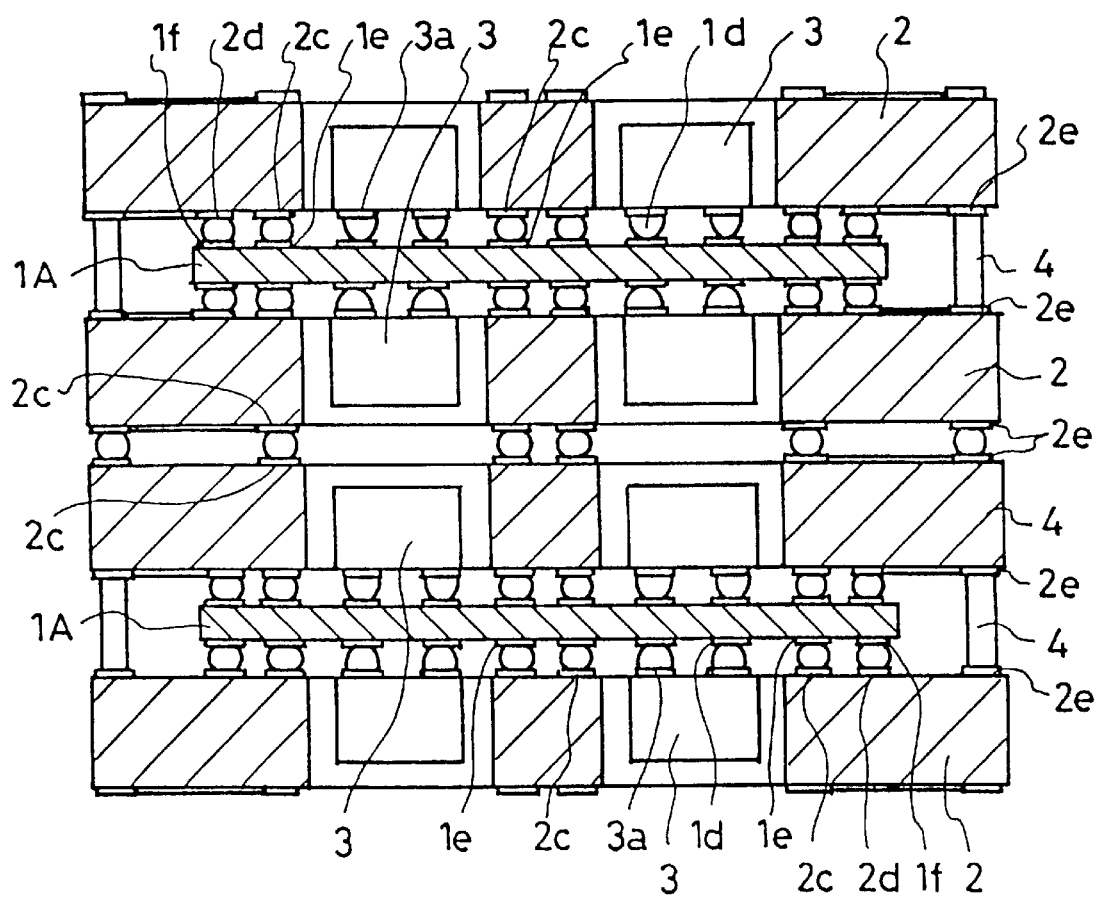
FIG. 15 is a sectional view of another example of semiconductor device according to Embodiment 13.

Furthermore, the semiconductor device shown in FIG. 15 can be obtained by stacking a plurality of the semiconductor devices shown in FIG. 14. In this example of Embodiment 13 shown in FIG. 15, the feeder electrodes 2c and the external input/output terminals 2e are provided on the back faces of the feeder substrate 2 and bonded to each other with the solder 4 when a plurality of the semiconductor devices are stacked, thereby constructing a semiconductor device comprising a plurality of semiconductor devices as an integrated unit. Therefore, according to the multi-layer semiconductor device shown in FIG. 15, three-dimensional packaging of the semiconductor elements 3 can be effected which can sharply increase the packaging density of the semiconductor elements 3 as compared to the size of the semiconductor device.

Embodiment 14

Figure 16:
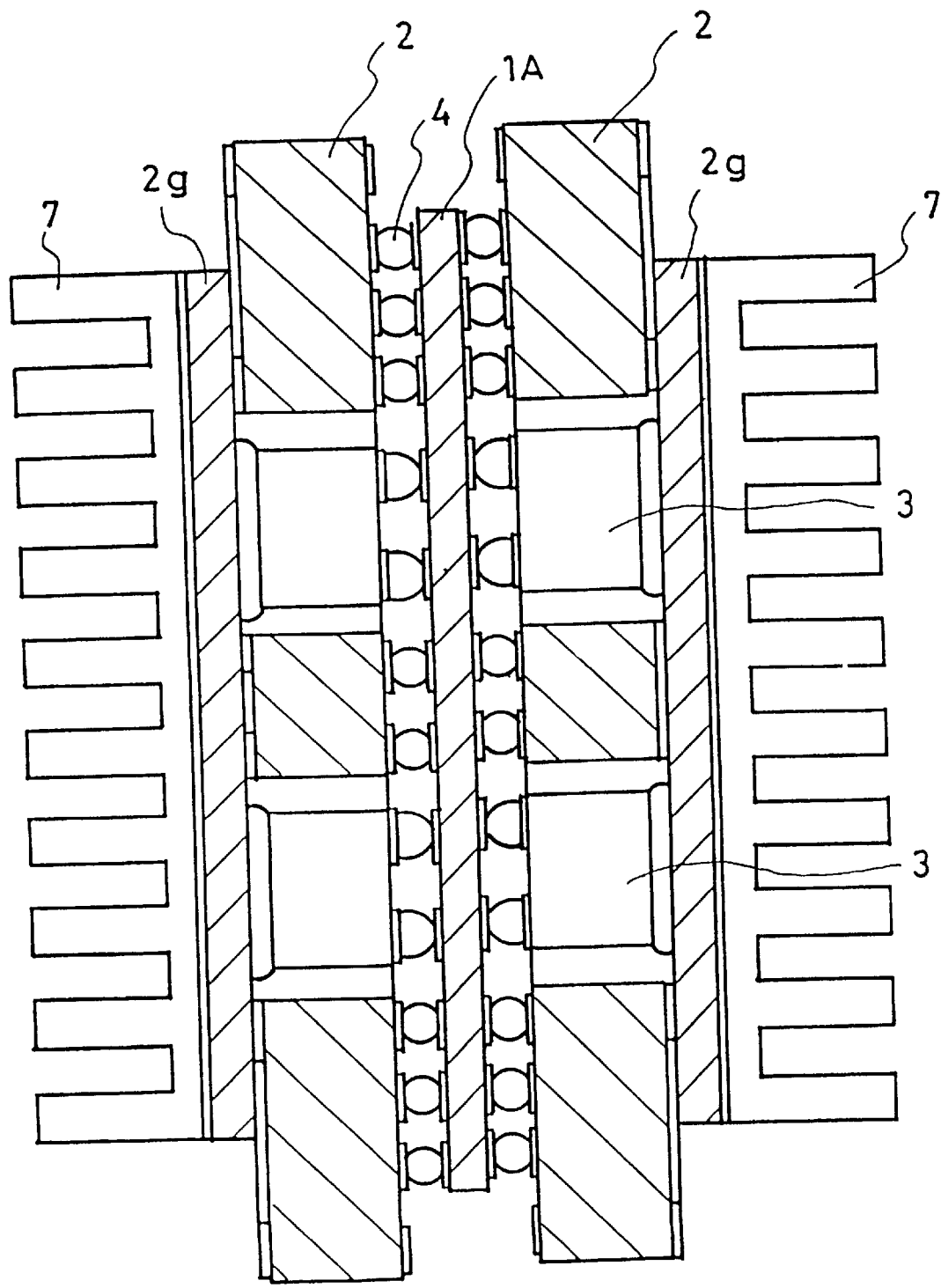
FIG. 16 is a sectional view of a semiconductor device according to Embodiment 14.

FIG. 16 is a sectional view of a semiconductor device according to Embodiment 14 of the present invention. In FIG. 16, the semiconductor device comprises a signal transmission substrate 1A, feeder substrates 2, semiconductor elements 3 and heat radiation fins 7. The signal transmission substrate 1A has flexibility because it is composed of a multi-layer comprising an insulator made of a polymer material and a metal conductor, and comprises element electrodes 1d, feeder electrodes 1e, inter-substrate input/output electrodes 1f and sealing pads 1h on both surfaces thereof. The electrical connection electrodes 3a of the semiconductor elements 3 are bonded to the element electrodes 1d on both surfaces of the signal transmission substrate 1A with solder 4, and the feeder substrates 2A are also bonded to both surfaces of the signal transmission substrate IA, containing the semiconductor elements 3. In other words, the feeder substrate 2 has hollow containers 2f and comprises feeder electrodes 2c, inter-substrate input/output electrodes 2d, external input/output terminals 2e and sealing pads 2h on the-front face thereof facing the signal transmission substrate. The semiconductor elements 3 bonded to the signal transmission substrate 1A are contained in the hollow containers 2f of two feeder substrates 2. A surface of the semiconductor element 3 opposite to the surface thereof where the electrical connection electrodes 3a are located is bonded to the bottom surface of the hollow container 2f with an adhesive 6. The two feeder substrates 2 are superposed upon both surfaces of the signal transmission substrate 1A, and the feeder electrodes 1e, inter-substrate input/output electrodes 1f and sealing pads 1h of the signal transmission substrate 1A are bonded to the feeder electrode 2c, inter-substrate input/output electrode 2d and sealing pad 2h of the feeder substrates 2 with the solder 4, respectively. The heat radiation fins 7 are bonded to the back faces of flat sheets 2g constituting the bottoms of the hollow containers 2f. In this way, a semiconductor device is constructed as an integrated unit.

Therefore, according to the semiconductor device of this Embodiment 14, since the signal transmission substrate 1A comprising the insulator and the conductor is made thin, the semiconductor elements 3 are bonded to both surfaces of this thin signal transmission substrate 1A which is sandwiched between two feeder substrates 2, and the semiconductor elements 3 are contained in the hollow containers 2f formed on the feeder substrates 2, the packaging density of the semiconductor elements 3 can be doubled. In addition, since the semiconductor elements 3 are bonded to both surfaces of the signal transmission substrate 1A which is sandwiched between the two feeder substrates 2, the semiconductor elements 3 can be sealed, thereby enhancing the reliability of the semiconductor device. As a result, it is possible to obtain a semiconductor device having high packaging density and high reliability.

Embodiment 15

Figure 17:
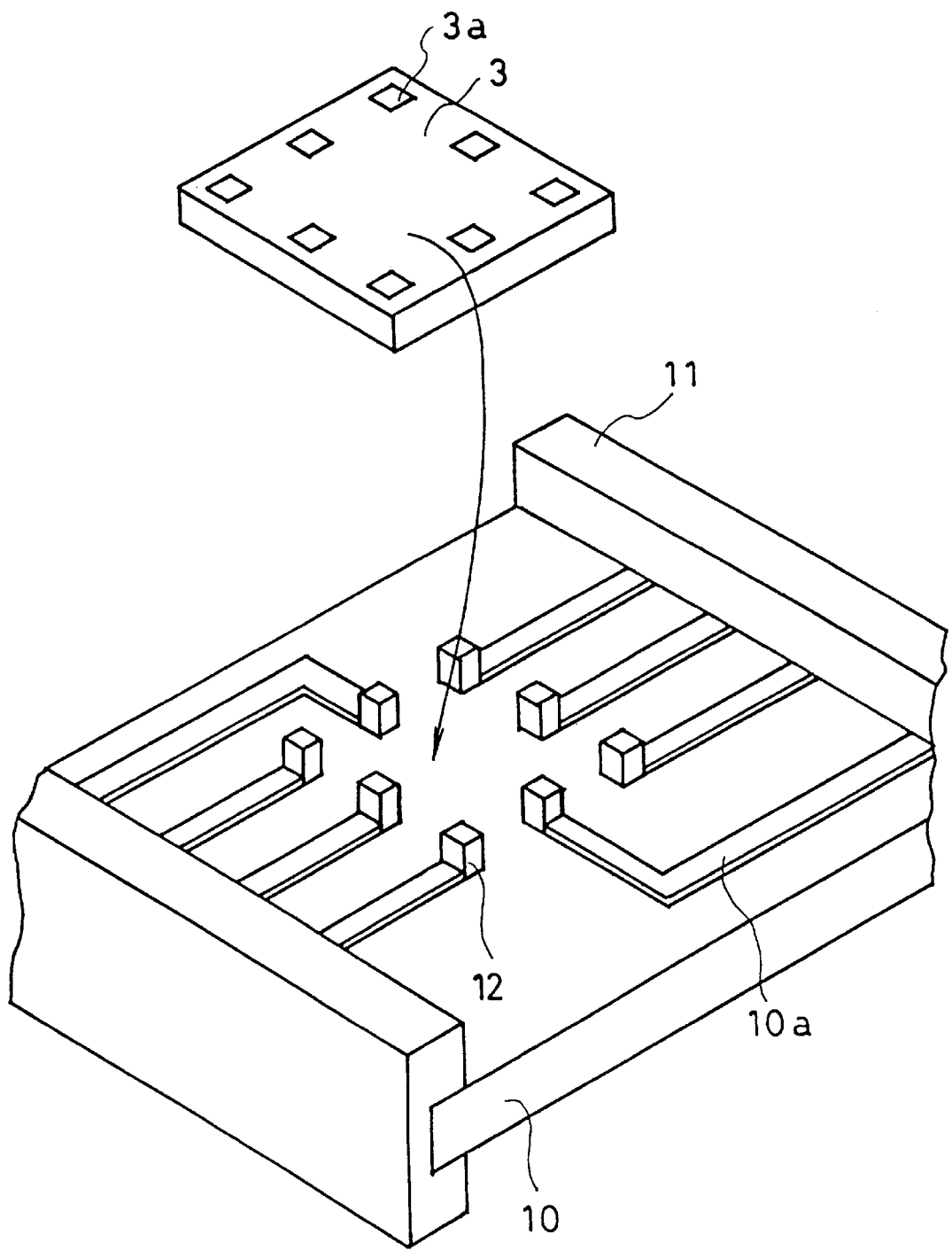
FIG. 17 is an exploded perspective view of a test substrate and a semiconductor element according to Embodiment 15.
Figure 18A:
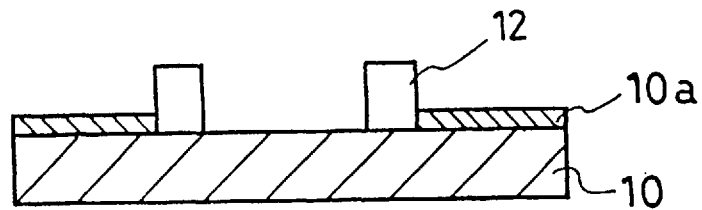
FIG. 18(a) illustrates one step of a method for testing the semiconductor element according to Embodiment 15 in which protruding electrodes are formed on the test substrate.
Figure 18B:
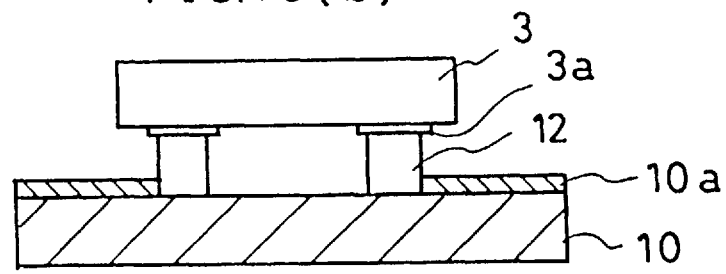
FIG. 18(b) illustrates another step of the method for testing the semiconductor element according to Embodiment 15 in which the semiconductor element is bonded to the protruding electrodes.
Figure 18C:
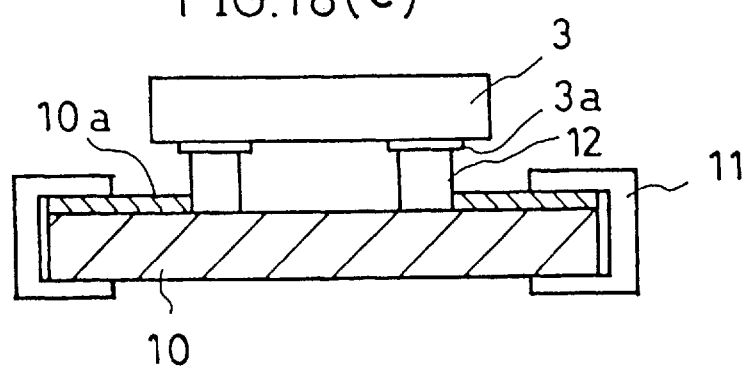
FIG. 18(c) illustrates another step of the method for testing the semiconductor element according to Embodiment 15 in which the semiconductor element is subjected to a burn-in test.
Figure 18D:
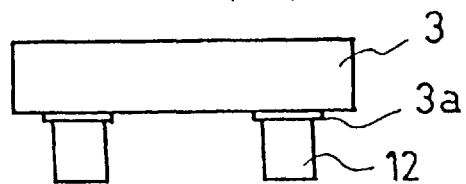
FIG. 18(d) illustrates another step of the method for testing the semiconductor element according to Embodiment 15 in which the semiconductor element is removed from the test substrate.

FIG. 17 is an exploded perspective view of a test substrate used for a method for testing a semiconductor element according to Embodiment 15 of the present invention and a semiconductor element to be tested. FIG. 18 is a sectional view of a semiconductor element to be tested by the method of Embodiment 15. FIG. 18(a) shows that protruding electrodes 12 are formed on the test substrate 10, FIG. 18(b) shows that the semiconductor element 3 is bonded to the protruding electrodes 12, FIG. 18(c) shows that a test is conducted, and FIG. 18(d) shows that the semiconductor element 3 is removed from the test substrate 10. In FIG. 17, the semiconductor element 3 is a bare chip cut from a wafer which has undergone a physical element formation process and has electrical connection electrodes 3a for signal transmission and power supply on one surface thereof. The test substrate 10 is made of a ceramic and has the same number of test wires 10a as that of the electrical connection electrodes 3a of the semiconductor element 3 formed on one surface thereof. The terminal end portions of the test wires 10a extended at both right and left ends of the test substrate 10 are electrically connected to the connectors 11 mounted at the both right and left ends of the test substrate 10. The protruding electrodes 12 are provided on the test substrate 10 at the top ends of the test wires 10a and arranged to face the electrical connection electrodes of the semiconductor element 3.

The method for testing the semiconductor element 3 is described hereinunder with reference to FIG. 18. As shown in FIG. 18(a), the protruding electrodes 12 are formed by patterning the resist in such a way that portions where the protruding electrodes 12 are to be formed are exposed from the test substrate 10 having the test wires 10a formed thereon, vapor-depositing tin and lead on a mask, heating the mask, and removing the resist. The side surface of this formed protruding electrode 12 is partly in contact with the top end portion of the test wire 10a. As shown in FIG. 18(b), the electrical connection electrodes 3a of the semiconductor element 3 are bonded to the protruding electrodes 12 by bringing the electrical connection electrodes 3a of the semiconductor element 3 into contact with the top surfaces of the protruding electrodes 12, and heating and applying pressure to this assembly. As shown in FIG. 18(c), the semiconductor element 3 is then exposed to an atmosphere heated to 150° C. while the connectors 11 are connected to the test wires 10a and electricity is applied to the semiconductor element 3 from the connectors 11 so as to conduct a burn-in test on the semiconductor element 3. After completion of this burn-in test, the semiconductor element 3 is removed from the test substrate 10. Since connection between the protruding electrode 12 and the electrical connection electrode 3a is metal-to-metal bonding and connection between the protruding electrode 12 and the test substrate 10 is metal-to-ceramic bonding when the semiconductor element 3 is removed, the bonding strength between the protruding electrode 12 and the electrical connection electrode 3a is larger than the bonding strength between the protruding electrode 12 and the test substrate 10. Therefore, as shown in FIG. 18(d), both the protruding electrodes 12 and the semiconductor element 3 are detached from the test substrate 10 as a single unit so that the semiconductor element 3 has the protruding electrodes 12 for each of its electrical connection electrodes 3a. Thereafter, as shown in FIG. 18(a), new protruding electrodes 12 are formed again on the test substrate 10 by the same method as described above, and then, a new semiconductor element 3 is bonded to the protruding electrodes 12, as shown in FIG. 18(b), undergoes the burn-in test as shown in FIG. 18(c), and is removed from the test substrate 10 as shown in FIG. 18(d), thereby repeating the test on the semiconductor elements 3.

Therefore, according to the method for testing the semiconductor element 3 of this Embodiment 15, since the protruding electrodes 12 remain on the semiconductor element 3 after the completion of the burn-in test, the formation of the protruding electrodes 12 on the semiconductor element 3 and the test are performed simultaneously, thereby making it possible to simplify the test process and reduce test costs.

In Embodiment 15, the test substrate 10 is made of a ceramic and the test wires 10a are directly formed on this ceramic substrate as described above and illustrated in the figures, but the same effect can be obtained from a test substrate 10 prepared by forming a layer of a polymer material such as polyimide and an epoxy resin on the ceramic substrate as the test substrate 10 and forming the test wires 10a on this layer.

Embodiment 16

Figure 19:
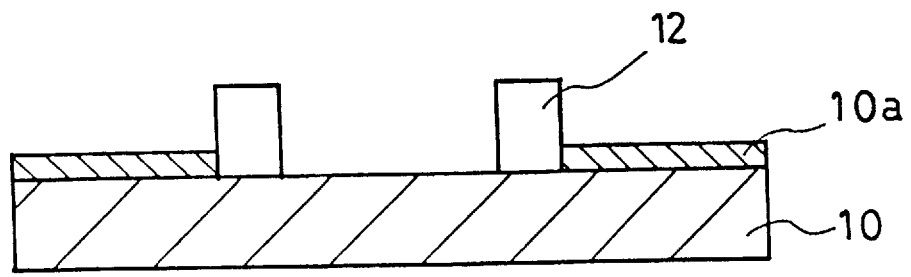
FIG. 19 is a sectional view of a test substrate according to Embodiment 16.

FIG. 19 is a sectional view of a test substrate according to Embodiment 16 of the present invention. In FIG. 19, the test substrate 10 is made of a ceramic and comprises test wires 10a on one surface thereof. The test wires 10a are formed as a thin film on the test substrate 10 by photoengraving technology using a resist and thin film formation technology such as sputtering. After the formation of the test wires 12, a resist is patterned on the test substrate 10 including the test wires 10a excluding portions where the protruding electrodes 12 are to be formed. Then tin and lead are deposited on a mask and heated, and the resist is removed to form the protruding electrodes 12 on the test substrate 10. The side surface of this protruding electrode 12 is partly in contact with the top end portion of the test wire 10a, and the lower end portion of thereof is in direct contact with the top surface of the test substrate 10.

Therefore, according to the test substrate 10 of this Embodiment 16, since the protruding electrodes 12 are formed on the top surface of the test substrate 10 made of a ceramic and the side surface of the protruding electrode 12 is connected to the end of the test wire 10a formed as a thin film, the bonding strength between the protruding electrode 12 and the test substrate 10 is made smaller than the bonding strength between the protruding electrode 12 and the electrical connection electrode 3a in the burn-in test of the semiconductor element 3 described in the above-mentioned Embodiment 15, thereby making it easy to remove the semiconductor element 3 from the test substrate 10 after the test of the semiconductor element 3 and also making it possible to carry out the formation of the protruding electrodes 12 on the semiconductor element 3 and the test of the semiconductor element 3 simultaneously.

Figure 20:
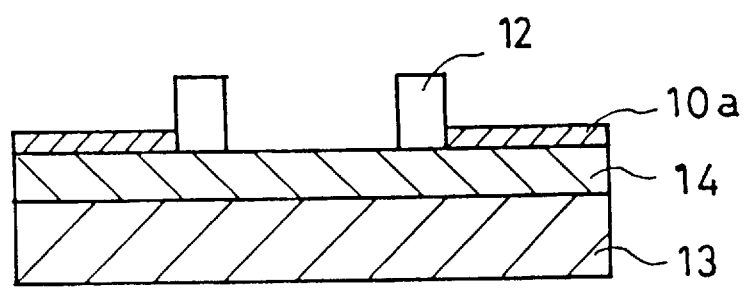
FIG. 20 is a sectional view of another example of test substrate according to Embodiment 16.

In this Embodiment 16, the test wires 10a are directly formed on the ceramic substrate as the test substrate 10 as described above and illustrated in the figure, but, as shown in FIG. 20, the same effect can be obtained from a test substrate prepared by forming a layer of the insulator 14 made of polyimide or an epoxy resin on the substrate 13 made of a ceramic or a polymer material having rigidity such as a printed circuit board and then forming the test wires 10a and the protruding electrodes 12 on this layer.

Embodiment 17

Figure 21A:
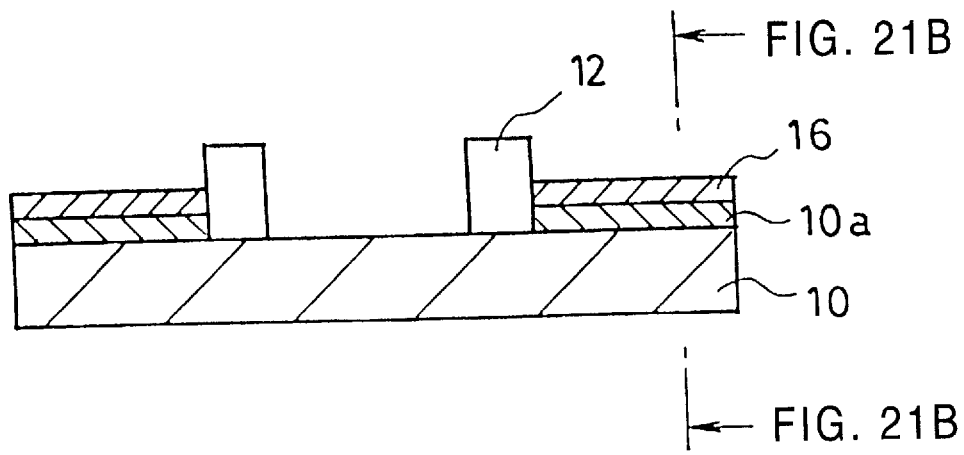
FIG. 21(a) is a sectional view of a test substrate according to Embodiment 17.

FIG. 21 is a sectional view of a test substrate according to Embodiment 17 of the present invention. In FIG. 21, the test substrate has test wires 10a and protruding electrodes 12 on one surface thereof. The test substrate 10 also has a coating film 16 on the surface having the test wires 10a. Polyimide is applied to the entire surface of the test substrate 10 having the test wires 10a during the period after the formation of the test wires 10a and before the formation of the protruding electrodes 12, or after the formation of the test wires 10a and the protruding electrodes 12, and the coating film 16 formed over the protruding electrodes 12 is removed by photoengraving technology.

Figure 21B:
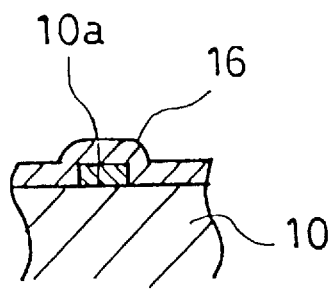
FIG. 21(b) is a side view of the test substrate illustrated in FIG. 21(a)

Therefore, according to the test substrate 10 of this Embodiment 17, as shown in FIG. 21(b), since both side portions of the coating film 16 covering the test wire 10a are in contact with the top surface of the substrate 10, the coating film 16 serves to fix the test wires 10a to the test substrate 10. Therefore, when the semiconductor element 3 (see FIG. 18) is removed from the test substrate 10, the test wires 10a can be prevented from separating from the test substrate 10 along with the protruding electrodes 12 which are removed together with the semiconductor element 3.

In this Embodiment 17, the coating film 16 is made of polyimide, but the same effect can be obtained by using a polymer material such as an epoxy resin as the material of the coating film 16.

Embodiment 18

Figure 22A:
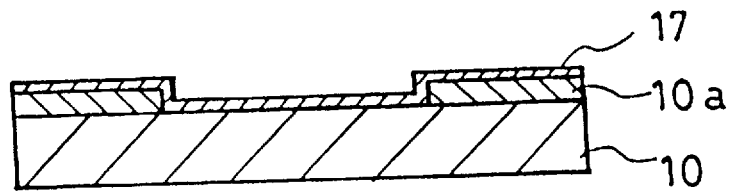
FIG. 22(a) illustrates one step of a method for producing the test substrate according to Embodiment 18 in which test wires are formed on the test substrate.
Figure 22B:
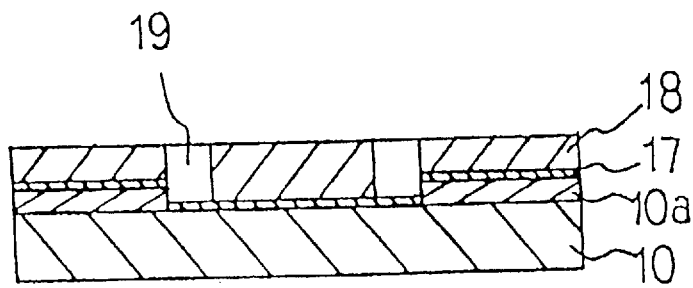
FIG. 22(b) illustrates another step of a method for producing the test substrate according to Embodiment 18 in which protruding electrodes are formed on the test substrate.
Figure 22C:
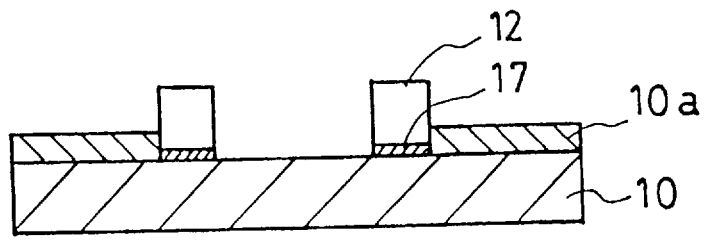
FIG. 22(c) illustrates the test substrate according to Embodiment 18 after the production of the substrate is complete.

FIG. 22 is a sectional view of a test substrate produced by a method for producing the same according to Embodiment 18 of the present invention. FIG. 22(a) shows the test substrate having test wires formed thereon, FIG. 22(b) shows the test substrate in the preliminary stage of forming protruding electrodes thereon, and FIG. 22(c) shows the complete test substrate. Firstly, in FIG. 22(a), after the test wires 10a are formed on one surface of the test substrate 10, a thin film conductor 17 made of copper is formed on this entire surface of the test substrate 10 having the test wires 10a by sputtering or vapor deposition. In this embodiment, the dry method such as sputtering is used to form the thin film conductor 17, but electroless plating may be used. Next, as shown in FIG. 22(b), holes 19 for forming protruding electrodes are formed on the thin film conductor 17 by patterning a resist 18. Thereafter, as shown in FIG. 22(c), protruding electrodes 12 are deposited and formed within the holes 19 for forming protruding electrodes by electroplating using the thin film conductors 17 exposed from the holes 19 as an electrode, and then the resist 18 and the thin film conductor 17 are removed.

Therefore, according to the method for producing the test substrate of Embodiment 18, since the protruding electrodes are formed by plating, the protruding electrodes made of many kinds of metals can be obtained easily.

In this Embodiment 18, the thin film conductor 17 is made of copper, but the same effect can be obtained by using any metal such as aluminum as the material of the thin film conductor 17. Solder is used as the material of the protruding electrode 12, but gold may be used instead.

Embodiment 19

Figure 23:
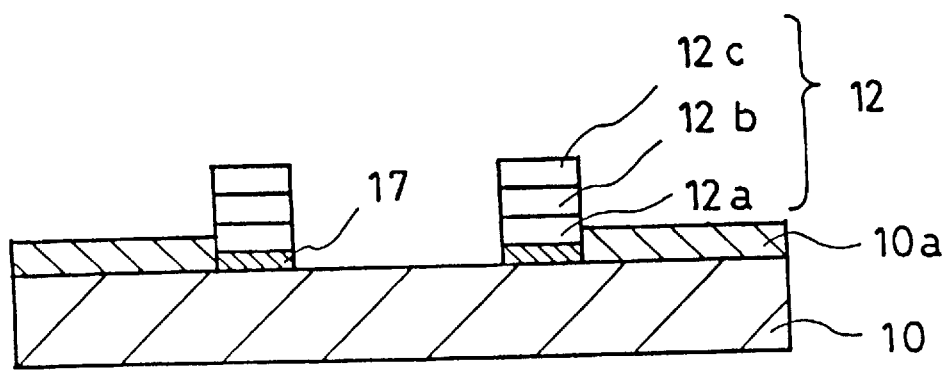
FIG. 23 is a sectional view of a test substrate according to Embodiment 19.

FIG. 23 is a sectional view of a test substrate according to Embodiment 19 of the present invention. The test substrate of this embodiment 19 is obtained by forming the protruding electrodes 12 made of many kinds of metals by means of the above-described production method of Embodiment 18. In FIG. 23, the protruding electrode 12 is formed by stacking a first layer 12a, a second layer 12b and a third layer 12c on the thin film conductor 17. The first and second layers 12a and 12b are made of solder and the third layer 12c is made of copper, but the first and third layers 12a and 12c may be made of gold and the second layer 12b may be made of copper. In this Embodiment 19, the protruding electrode 12 is made of two different kinds of metals, but may be made of three different kinds of metals for each layer. The material of the first layer 12a is determined by the connection relation between the protruding electrode 12 and the printed circuit board, and the material of the third layer 12c is determined by the connection relation between the protruding electrode 12 and the semiconductor element 3. A metal layer of titanium, chromium or nickel, for example, having a thickness of several thousands angstroms may be formed at the interfaces between the first layer 12a and the second layer 12b and between the second layer 12b and the third layer 12c in order to increase the bonding strength among these layers.

Therefore, according to the test substrate of this Embodiment 19, since the protruding electrode 12 is made of a plurality of metals, not only solder connection but also gold-to-gold thermal diffusion bonding are possible, thereby expanding the conditions for bonding the protruding electrodes 12 to a wiring board for mounting tested semiconductor elements.

Embodiment 20

Figure 24:
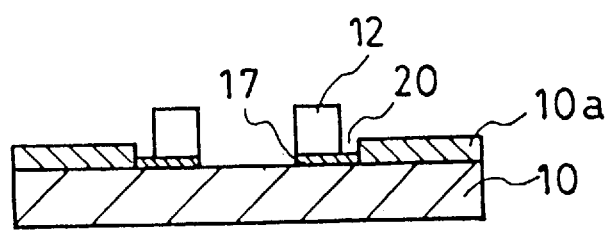
FIG. 24 is a sectional view of a test substrate according to Embodiment 20.

FIG. 24 is a sectional view of a test substrate according to Embodiment 20 of the present invention. In this Embodiment 20, protruding electrodes 12 are formed by the above-described production method of Embodiment 18. However, as shown in FIG. 24, a gap 20 is formed between the protruding electrode 12 and the test wire 10a in this Embodiment. In other words, the test wire 10a is arranged such that the top end portion thereof is separated by the gap 20 from a portion of the test substrate 10 where the protruding electrode 12 is to be formed. When the resist for forming the protruding electrode is patterned, the hole for forming the protruding electrode is formed at a normal position apart from the top end portion of the test wire 10a by the gap 20. And then, the protruding electrode 12 is formed. When the resist is removed after the formation of the protruding electrode 12, the gap 20 is formed between the protruding electrode 12 and the test wire 10a so that a portion of the thin film conductor 17 having a small width is exposed from the gap 20.

Therefore, according to the test substrate of this Embodiment 20, since the protruding electrode 12 and the test wire 10a are interconnected by the thin film conductor 17 having a thickness smaller than that of the test wire 10a, when the semiconductor element 3 is removed from the test substrate 10 after the test, the stripping force of the protruding electrode 12 which is removed together with the semiconductor element 3 is not conveyed to the top end portion of the test wire 10a, and only extremely small amount of force is generated by the thin film conductor 17 which is lifted by the separating protruding electrode 12. This thin film conductor 17 is broken before the test wire 10a is separated from the test substrate 10. As a result, the test wires 10a securely remain on the test substrate 10, and the protruding electrodes 12 are removed from the test substrate 10, taking the thin film conductor 17 therewith, thereby making it easy to remove the protruding electrodes 12 from the test substrate 10.

Embodiment 21

Figure 25:
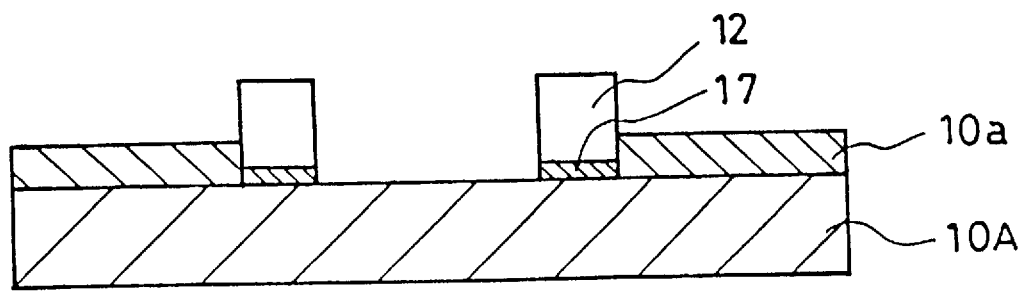
FIG. 25 is a sectional view of a test substrate according to Embodiment 21.

FIG. 25 is a sectional view of a test substrate according to Embodiment 21 of the present invention. In FIG. 25, the test substrate 10A has flexibility because it is made of a polymer material such as polyimide. Test wires 10a are formed on one surface of this test substrate 10A, a thin film conductor 17 is formed on a portion of the test substrate 10A where a protruding electrode 12 is to be formed, and the protruding electrode 12 is formed upon the thin film conductor 17. The test wires 10a may be formed either by bonding a conductive film as the test wire 10a to the test substrate 10A with an unshown adhesive, sputtering or vapor depositing a conductor as the test wire 10a on the test substrate 10A, or plating the test substrate 10A with a conductor as the test wire 10a. An epoxy resin may be used as the polymer material of the test substrate 10A.

Therefore, according to the test substrate of this Embodiment 21, since the test substrate 10A has flexibility because it is made of a polymer material, when the semiconductor element is removed from the test substrate 10A after the test, the protruding electrodes 12 can be easily removed from the test substrate 10A due to its good separating property from the polymer material.

Embodiment 22

Figure 26:
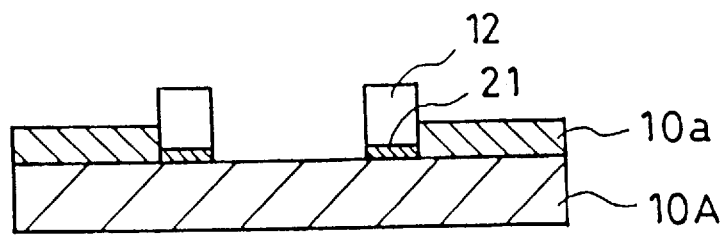
FIG. 26 is a sectional view of a test substrate according to Embodiment 22.

FIG. 26 is a sectional view of a test substrate according to Embodiment 22 of the present invention. The test substrate of this Embodiment 22 is obtained by substituting the thin film conductor 17 of the above-mentioned Embodiment 21 with a metal thin film 21. In other words, in FIG. 26, test wires 10a are formed on one surface of the test substrate 10A which has flexibility because it is made of a polymer material such as polyimide and an epoxy resin, the metal thin film 21 is formed by sputtering or vapor deposition on a portion of the test substrate 10A where the protruding electrode is to be formed, and the protruding electrode 12 is formed on the metal thin film 21.

Therefore, according to the test substrate of this Embodiment 22, since the protruding electrodes 12 are provided on the test substrate 10A which has flexibility because it is made of a polymer material with the metal thin film 21 provided therebetween, the protruding electrode 12 can be easily removed from the test substrate 10A when the semiconductor element 3 is stripped after the test due to the small bonding strength between the metal thin film 21 and the polymer material.

Embodiment 23

Figure 27A:
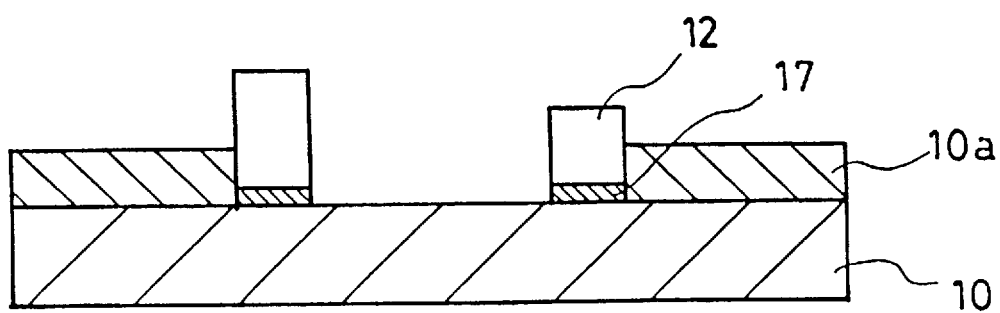
FIG. 27(a) illustrates the test substrate produced by a method according to Embodiment 23 on which protruding electrodes have been formed.
Figure 27B:
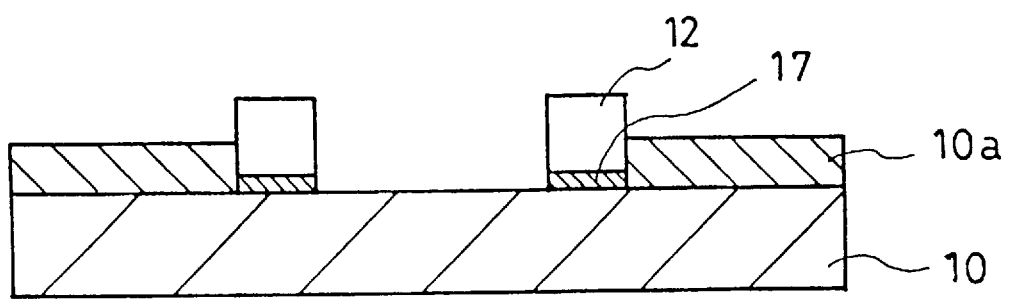
FIG. 27(b) illustrates the test substrate produced by a method according to Embodiment 23 after the protruding electrodes have been polished.

FIG. 27 is a sectional view of a test substrate produced by a method for producing the test substrate according to Embodiment 23 of the present invention. FIG. 27(a) shows the test substrate having protruding electrodes formed thereon, and FIG. 27(b) shows the test substrate having the polished protruding electrode. In FIG. 27(a), the test substrate 10 made of a ceramic has on one surface thereof test wires 10a and thin film conductors 17 having protruding electrodes 12 thereon. From a micro viewpoint of semiconductor technology, it is possible that the protruding electrodes 12 are different in height from each other when they are formed on the thin film conductors 17. Then after the formation of the protruding electrodes 12, the top surfaces of the protruding electrodes 12 are polished to make all of uniform height as shown in FIG. 27(b). This polishing is made with an unwoven polyurethane fabric using colloidal silica as a polishing liquid.

Therefore, according to the test substrate production method of this Embodiment 23, since the top surfaces of the protruding electrodes 12 are polished after they are formed, the protruding electrodes 12 can be all made of uniform height, and the uniform bonding between the protruding electrodes 12 and the semiconductor element is made possible.

Embodiment 24

Figure 28A:
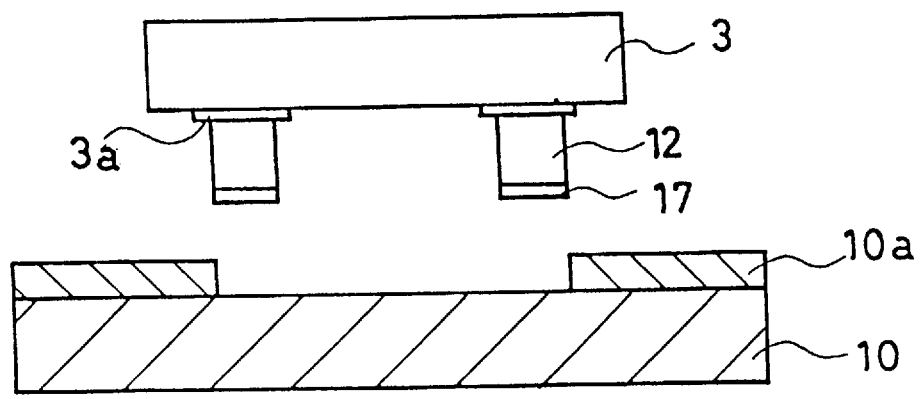
FIG. 28(a) illustrates a semiconductor element which is tested by a method according to Embodiment 24 being removed from the test substrate after the test is complete.
Figure 28B:
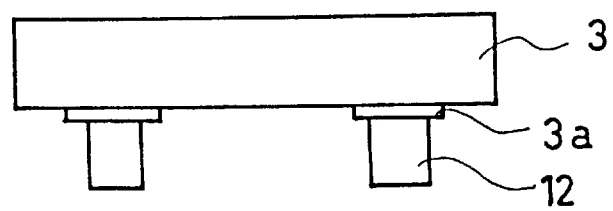
FIG. 28(b) illustrates the semiconductor element shown in FIG. 28(a) being subjected to after-treatment.

FIG. 28 is a sectional view of a semiconductor element to be tested by a method according to Embodiment 24 of the present invention. FIG. 28(a) shows that the semiconductor element 3 is removed from the test substrate 10 after the test, and FIG. 28(b) shows that the semiconductor element 3 is subjected to after-treatment. As shown in FIG. 28(a), when the semiconductor element 3 is removed from the test substrate 10 after the test, the thin film conductor 17 and the protruding electrode 12 are removed from the test substrate 10 together with the semiconductor element 3 as a single unit since the bonding strength between the protruding electrode 12 and the electrical connection electrode 3a is larger than the bonding strength between the thin film conductor 17 and the test substrate 10. As a result, the semiconductor 3 has the protruding electrodes 12 for each of the electrical connection electrodes 3a. Thereafter, as shown in FIG. 28(b), all the surfaces of the semiconductor element 3 removed from the test substrate 10 are exposed to an etchant so as to etch the thin film conductor 17. When the thin film conductor 17 is made of copper, an ammonium persulfate solution is used as the etchant.

Therefore, according to the semiconductor element test method of this Embodiment 24, since the protruding electrodes 12 bonded to the semiconductor element 3 are exposed to the etchant to remove the thin film conductor 17 after the semiconductor element 3 is removed from the test substrate 10 after the test, the surface of the protruding electrode 12 can be cleaned and the reliability of bonding between the semiconductor element 3 and a wiring board for mounting the semiconductor element 3 after the test can be improved.

Embodiment 25

Figure 29A:
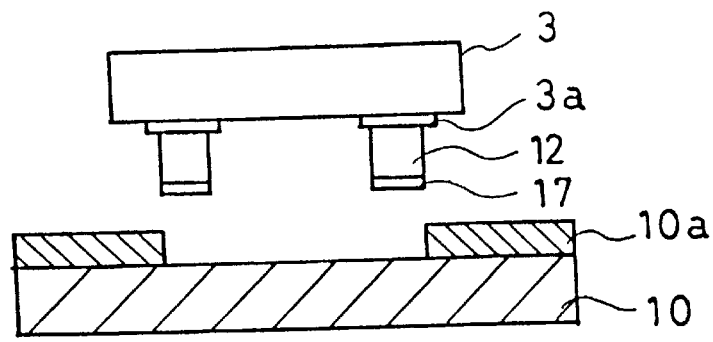
FIG. 29(a) illustrates a semiconductor element which is tested by a method according to Embodiment 25 being removed from the test substrate after the test is complete.
Figure 29B:
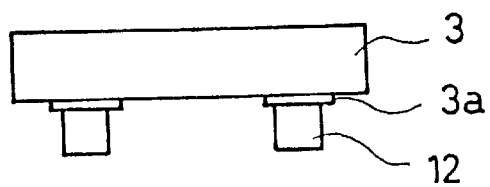
FIG. 29(b) illustrates the semiconductor element shown in FIG. 29(a) being subjected to after-treatment.
Figure 30:
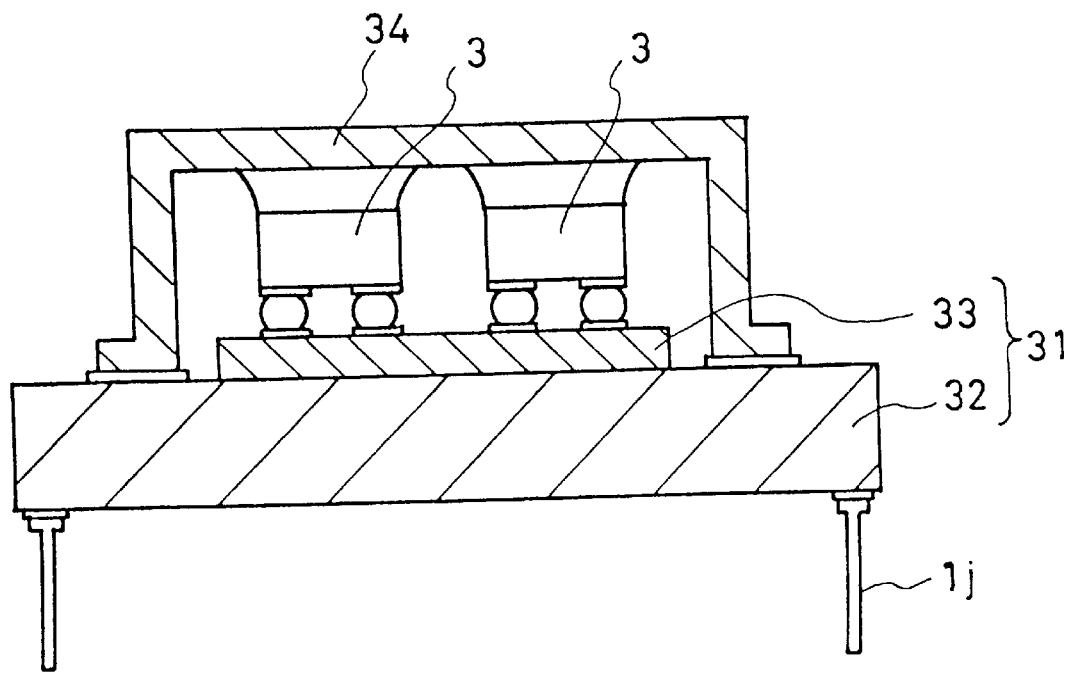
FIG. 30 is a sectional view of a prior art semiconductor device.
Figure 31A:
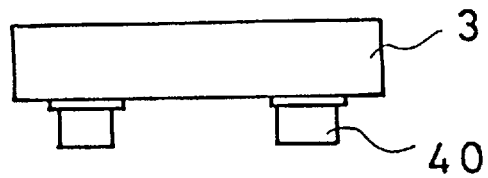
FIG. 31(a) illustrates one step of a conventional method for testing the semiconductor element in which high melting point solder is formed on the semiconductor element.
Figure 31B:
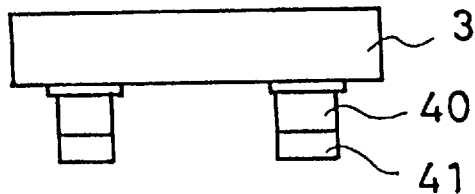
FIG. 31(b) illustrates another step of the conventional method for testing the semiconductor element in which low melting point solder is formed on the high melting point solder.
Figure 31C:
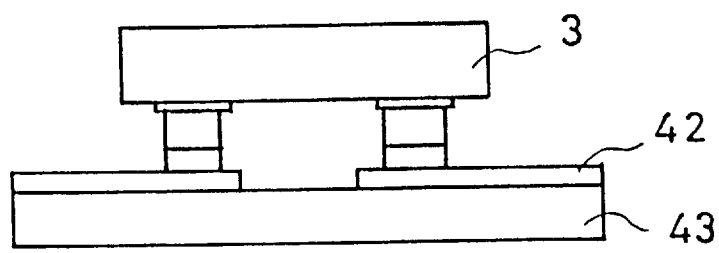
FIG. 31(c) illustrates another step of the conventional method for testing the semiconductor element in which the low melting point solder is bonded to a test wire.
Figure 31D:
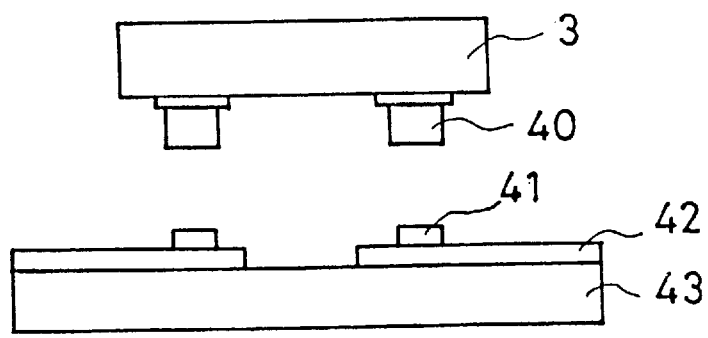
FIG. 31(d) illustrates another step of the conventional method for testing the semiconductor element in which the semiconductor element is removed from the test wire.
Figure 31E:
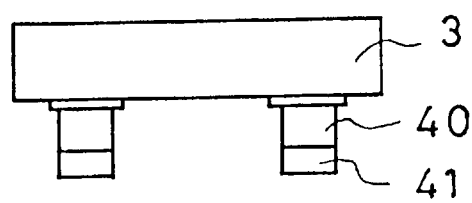
FIG. 31(e) illustrates another step of the conventional method for testing the semiconductor element in which the low melting point solder is again formed on the high melting point solder.

FIG. 29 is a sectional view of a semiconductor element to be tested by a method according to Embodiment 25 of the present invention. FIG. 29(a) shows that the semiconductor element 3 is removed from the test substrate 10 after the test, and FIG. 29(b) shows that the semiconductor element 3 is subjected to after-treatment. As shown in FIG. 29(a), when the semiconductor element 3 is removed from the test substrate 10 after the test, the thin film conductors 17 and the protruding electrodes 12 are removed from the test substrate 10 together with the semiconductor element 3 as a single unit since the bonding strength between the protruding electrode 12 and the electrical connection electrode 3a is larger than the bonding strength between the thin film conductor 17 and the test substrate 10. As a result, the semiconductor 3 has the protruding electrodes 12 for each of the electrical connection electrodes 3a. Thereafter, as shown in FIG. 29(b), a lower surface of the protruding electrode 12 removed from the test substrate 10 is polished to remove the thin film conductor 17. This polishing is made with an unwoven polyurethane fabric using colloidal silica as a polishing liquid.

Therefore, according to the semiconductor element test method of this Embodiment 25, since the protruding electrode 12 bonded to the semiconductor element 3 is polished after the semiconductor element 3 is removed from the test substrate 10, the surface of the protruding electrode 12 can be cleaned and the protruding electrodes can be all made of uniform height. As a result, when the tested semiconductor element 3 is mounted on a wiring board, the protruding electrodes 12 are all made of uniform height, thereby making it possible to improve bonding reliability.

According to the first aspect of the invention, since the signal transmission substrate and the feeder substrate are superposed upon and bonded to each other and the semiconductor elements bonded to the signal transmission substrate are contained in the containers of the feeder substrate, the semiconductor device can be made thin and small in size.

In addition, since the semiconductor elements are bonded to the wiring layer of the signal transmission substrate, the length of the signal passage between adjacent semiconductor elements can be shortened and high-speed signal processing is possible.

According to the second aspect of the invention, since the open container is open on the back face of the feeder substrate which does not face the signal transmission substrate when the signal transmission substrate and the feeder substrate are superposed upon and bonded to each other, heat generated from the semiconductor element can be radiated quickly from the open container to the outside of the back face of the feeder substrate.

According to the third aspect of the invention, since the base of the signal transmission substrate is made of a material having a thermal expansion coefficient approximate to that of the semiconductor element, the base supports the wiring layer and the amount of thermal stress generated at the connection between the semiconductor element and the signal transmission substrate is reduced, thereby making it possible to secure the electrical connection between the semiconductor elements and the signal transmission substrate.

According to the fourth aspect of the invention, since the base of the signal transmission substrate has removed portions, when the signal transmission substrate is bonded to the feeder substrate, portions of the wiring layer corresponding to the removed portions are displaced along the uneven surface of the feeder substrate, thereby making it possible to improve electrical connection.

According to the fifth aspect of the invention, since the open container containing the semiconductor element is filled with the polymer resin, the areas around the connection between the semiconductor element and the signal transmission substrate and around the connection between the signal transmission substrate and the feeder substrate can be made water-tight, and the polymer resin charged into the connection between the semiconductor element and the signal transmission substrate and the connection between the signal transmission substrate and the feeder substrate alleviates thermal stress at these connections, thereby making it possible to improve the electrical connections between the semiconductor element and the signal transmission substrate and between the signal transmission substrate and the feeder substrate.

According to the sixth aspect of the invention, since the semiconductor element is bonded to the signal transmission substrate within the hollow container, the semiconductor element can be sealed with the hollow container and the signal transmission substrate and accordingly, a specific sealing cap is not required. In addition, since heat generated from the semiconductor element is radiated from the bottom of the hollow container to the outside of the back face of the feeder substrate, heat radiation can be secured without the need for a heat radiation fin.

According to the seventh aspect of the invention, since the signal transmission substrate and the feeder substrate are superposed upon each other and their electrical connection electrodes and sealing pads are bonded to each other at the same time, the number of production processes can be reduced.

According to the eighth aspect of the invention, since the semiconductor element is bonded to the bottom surface of the hollow container and the heat radiation fin is provided on the back face of the feeder substrate which constitutes semiconductor element can be quickly conveyed to the heat radiation fin and radiated to the outside of the semiconductor device.

According to the ninth aspect of the invention, since the feeder substrate is sandwiched between two signal transmission substrates and the semiconductor elements bonded to the two signal transmission substrates are contained in the feeder substrate back to back, the thickness of the semiconductor device is not so large and yet the packaging density of the semiconductor elements can be doubled.

According to the tenth aspect of the invention, since the signal transmission substrate has flexibility and is displaced along the uneven surface of the feeder substrate, the signal transmission substrate absorbs thermal stress at its connection with the semiconductor element and the electrical connection between the semiconductor element and the signal transmission substrate can be secured.

According to the eleventh aspect of the invention, since the signal transmission substrate has flexibility without a support base, the metal film provided on the rear face of the signal transmission substrate provides an electromagnetic shield to the wiring of the semiconductor device, thereby achieving high noise resistance.

According to the twelfth aspect of the invention, since the input/output terminals are provided on the back face of the signal transmission substrate, when the semiconductor device is mounted on the mother board, the input/output terminals are displaced along the uneven surface of the mother board, thereby making it possible to improve the reliability of electrical connection between the semiconductor device and the mother board.

According to the thirteenth aspect of the invention, since the signal transmission substrate has the input/output terminals and the feeder substrate has also the input/output terminals, these input/output electrodes can be divided for signal transmission and power supply applications, and various-sized electrodes can be formed for each application purpose, thereby making it possible to improve the performance of the semiconductor device.

According to the fourteenth aspect of the invention, since the bottom of the hollow container has pores, heat generated from the semiconductor element can be radiated to the outside of the back face of the feeder substrate efficiently. In addition, since the adhesive enters the pores when the semiconductor element is bonded to the bottom surface of the hollow container with the adhesive, the thickness of the adhesive present between the semiconductor element and the bottom surface of the hollow container is made small, and accordingly, heat generated from the semiconductor element can be radiated to the outside of the back face of the feeder substrate efficiently. Furthermore, when the heat radiation fin is provided on the back face of the feeder substrate, the adhesive entering the pores flows to the back face of the feeder substrates and serves efficiently as an adhesive for bonding the heat radiation fin, thereby making it possible to install the heat radiation fin on the feeder substrate with high efficiency.

According to the fifteenth aspect of the invention, since the signal transmission substrate is made thin, the semiconductor elements are bonded to both surfaces of the thin signal transmission substrate which is sandwiched between two feeder substrates, and the semiconductor elements are contained in the feeder substrates, the thickness of the semiconductor device is increased only by the thickness of a single feeder substrate and yet the packaging density of the semiconductor elements can be doubled.

According to the sixteenth aspect of the invention, since the signal transmission substrate is made thin, and the semiconductor elements are bonded to both surfaces of this thin signal transmission substrate which is sandwiched between two feeder substrates, the semiconductor elements can be sealed and high-density packaging and high reliability can be achieved.

According to the seventeenth aspect of the invention, since the protruding electrodes are removed from the test substrate together with the semiconductor element when the semiconductor element is removed from the test substrate and remain on the semiconductor element, a semiconductor element test and the formation of the protruding electrodes on the semiconductor element can be performed at the same time, thereby making it possible to simplify the test process and reduce test costs.

According to the eighteenth aspect of the invention, since the protruding electrode is formed on the insulator of the test substrate and connected to the end surface of the test wire, the bonding strength between the protruding electrode and the test substrate is smaller than the bonding strength between the protruding electrode and the semiconductor element, thereby making it easy to remove the semiconductor element from the test substrate after the test and possible to secure the formation of the protruding electrodes on the semiconductor element.

According to the nineteenth aspect of the invention, since the polymer resin covers the test wires excluding the protruding electrodes and supports the test wires, when the protruding electrodes are removed from the test substrate together with the semiconductor element, the test wires can be prevented from separating from the test substrate.

According to the twentieth aspect of the invention, since the protruding electrode is formed by plating, a protruding electrode made of many kinds of metals can be obtained with ease.

According to the twenty-first aspect of the invention, since the protruding electrode is made of a plurality of metals, gold-to-gold thermal diffusion bonding is made possible in addition to solder bonding, thereby expanding the conditions for connecting the semiconductor elements to According to the twenty-second aspect of the invention, since the protruding electrodes and the test wires are interconnected by the thin film conductor thinner than the test wire, the protruding electrodes can be removed easily from the test substrate, leaving the test wires on the test substrate.

According to the twenty-third aspect of the invention, since the test substrate is composed of a polymer resin and a metal, the test substrate has flexibility and the protruding electrodes can be easily removed from the test substrate when the semiconductor element is removed from the test substrate after the test.

According to the twenty-fourth aspect of the invention, since gold is provided between the test substrate made of a polymer resin and the protruding electrode, the bonding strength between the protruding electrode and the test substrate becomes small, thereby making it easy to remove the semiconductor element from the test substrate.

According to the twenty-fifth aspect of the invention, since top end portions of the protruding electrodes are polished after the protruding electrodes are formed on the test substrate, the protruding electrodes are all made of uniform height and uniform connection between the semiconductor element and the protruding electrodes is possible.

According to the twenty-sixth aspect of the invention, since a top end portion of the protruding electrode is etched after the protruding electrodes are removed from the test substrate together with the semiconductor element, the surface of the protruding electrode is cleaned and accordingly, connection between the semiconductor element and the wiring board can be improved.

According to the twenty-seventh aspect of the invention, since top end portions of the protruding electrodes are polished after the protruding electrodes are removed from the test substrate together with the semiconductor element, the protruding electrodes are all made of uniform height and accordingly, connection between the semiconductor element and the wiring board can be improved.

What is claimed is:

1. A method for testing a semiconductor element having electrical connection electrodes which comprises the steps of:

forming protruding electrodes on a test substrate having test wires to electrically connect the protruding electrodes with the test wires;

bonding the electrical connection electrodes of the semiconductor element to the protruding electrodes of the test substrate;

testing the semiconductor element in a heated atmosphere; and removing the protruding electrodes from the test substrate together with the electrical connection electrodes of the semiconductor element by removing the semiconductor element from the test substrate after the step of testing the semiconductor element.

2. The method for testing a semiconductor element according to claim 1, which comprises the step of:

etching a portion of the protruding electrodes after the step of removing the electrical connection electrodes from the test substrate together with the protruding electrodes.

3. The method for testing a semiconductor element according to claim 1, which comprises the step of:

polishing a portion of the protruding electrodes after the step of removing the electrical connection electrodes from the test substrate together with the protruding electrodes.

4. The method for testing a semiconductor element according to claim 1, wherein the step of forming protruding electrodes on the test substrate comprises the steps of:

patterning a resist to create holes which correspond to positions on the test substrate at which the protruding electrodes are to be formed;

placing the resist on the test substrate;

depositing material for creating the protruding electrodes within the holes of the resist;

heating the resist after the material has been deposited; and removing the resist from the test substrate.

5. The method for testing a semiconductor element according to claim 1, wherein the protruding electrodes and electrical connection electrodes are made of metal, wherein the step of bonding the electrical connection electrodes of the semiconductor element to the protruding electrodes of the test substrate forms a metal-to-metal bonding connection between the electrical connection electrodes and the protruding electrodes, wherein the step of forming the protruding electrodes on the test substrate forms a metal-to-substrate bonding connection between the protruding electrodes and the test substrate, and wherein the metal-to-metal bonding connection is stronger than the metal-to-substrate bonding connection.

6. The method for testing a semiconductor element according to claim 5, wherein the test substrate is made of ceramic and the metal-to-substrate bonding connection is a metal-to-ceramic bonding connection.

7. The method for testing a semiconductor element according to claim 1, further comprising the step of:

forming new protruding electrodes on the test substrate to electrically connect the new protruding electrodes with the test wires after the step of removing the protruding electrodes from the test substrate together with the electrical connection electrodes.

8. The method for testing a semiconductor element according to claim 7, further comprising the steps of:

bonding new electrical connection electrodes of a new semiconductor element to the new protruding electrodes of the test substrate;

testing the new semiconductor element in a heated atmosphere; and removing the new protruding electrodes from the test substrate together with the new electrical connection electrodes of the new semiconductor element by removing the new semiconductor element from the test substrate after the step of testing the new semiconductor element.

9. The method for testing a semiconductor element according to claim 1, wherein the step of forming protruding electrodes on the test substrate comprises the step of:

forming thin film conductor portions on the test substrate and forming the protruding electrodes on the thin film conductor portions.

10. The method for testing a semiconductor element according to claim 9, wherein the thin film conductor portions are respectively formed such that a first conductor side of the thin film conductor portions are disposed against a first test wire side of the test wires, and wherein the protruding electrodes are respectively formed such that a first electrode side of the protruding electrodes are disposed against the first test wire side of the test wires and a second electrode side of the protruding electrodes are disposed against a second conductor side of the thin film conductor portions.

11. The method for testing a semiconductor element according to claim 9, wherein the step of forming the thin film conductor portions on the test substrate and forming the protruding electrodes on the thin film conductor portions comprises the steps of:

forming a thin film conductor on a surface of the substrate on which the test wires are formed;

patterning a resist to create holes which correspond to positions on the test substrate at which the protruding electrodes are to be formed;

placing the resist on the test substrate;

depositing material for creating the protruding electrodes within the holes of the resist such that the material is deposited on parts the thin film conductor; and removing the resist and the thin film conductor except for the parts of the thin film conductor on which the protruding electrodes have been deposited.

12. The method for testing a semiconductor element according to claim 11, wherein the step of depositing the material for creating the protruding electrodes comprises the step of:

depositing the material within the holes via an electroplating process which uses the parts of the thin film conductor as electrodes.

13. The method for testing a semiconductor element according to claim 9, wherein the protruding electrodes and electrical connection electrodes are made of metal, wherein the step of bonding the electrical connection electrodes of the semiconductor element to the protruding electrodes of the test substrate forms a metal-to-metal bonding connection between the electrical connection electrodes and the protruding electrodes, wherein the step of forming the thin film conductor portions on the test substrate and forming the protruding electrodes on the thin film conductor portions forms a metal-to-conductor bonding connection between the protruding electrodes and the thin film conductor portions and forms a conductor-to-substrate bonding connection between the thin film conductor portions and the test substrate, and wherein the metal-to-metal bonding connection and the metal-to-conductor bonding connection are stronger than the conductor-to-substrate bonding connection.

14. The method for testing a semiconductor element according to claim 9, wherein the step of removing the protruding electrodes from the test substrate together with the electrical connection electrodes comprises the step of:

removing the protruding electrodes from the test substrate together with the thin film conductor portions.

15. The method for testing a semiconductor element according to claim 14, further comprising the step of:

removing the thin film conductor portions from the protruding electrodes by etching a portion of the protruding electrodes, wherein the thin film conductor portions are removed from the protruding electrodes after the step of removing the electrical connection electrodes from the test substrate together with the protruding electrodes.

16. The method for testing a semiconductor element according to claim 14, further comprising the step of:

removing the thin film conductor portions from the protruding electrodes by polishing a portion of the protruding electrodes, wherein the thin film conductor portions are removed from the protruding electrodes after the step of removing the electrical connection electrodes from the test substrate together with the protruding electrodes.

17. The method for testing a semiconductor element according to claim 1, wherein a first bonding strength between said electrical connection electrodes and said protruding electrodes is larger than a second bonding strength between said protruding electrodes and said test substrate.

18. The method for testing a semiconductor element according to claim 1, wherein said protruding electrodes and said electrical connection electrodes are removed from the test substrate without heating said protruding electrodes and said semiconductor element.

* * * * *